US010847586B2

(12) United States Patent
Lee

(10) Patent No.: US 10,847,586 B2
(45) Date of Patent: Nov. 24, 2020

(54) DISPLAY DEVICE AND METHOD OF FABRICATING THE SAME

(71) Applicant: Samsung Display Co., Ltd., Yongin-Si (KR)

(72) Inventor: Hyeonbum Lee, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/534,908

(22) Filed: Aug. 7, 2019

(65) Prior Publication Data

US 2020/0111856 A1 Apr. 9, 2020

(30) Foreign Application Priority Data

Oct. 5, 2018 (KR) ........................ 10-2018-0118735

(51) Int. Cl.
*H01L 27/32* (2006.01)
*H01L 51/52* (2006.01)
*H01L 27/146* (2006.01)

(52) U.S. Cl.
CPC .... *H01L 27/3225* (2013.01); *H01L 27/14621* (2013.01); *H01L 27/14685* (2013.01); *H01L 27/322* (2013.01); *H01L 27/323* (2013.01); *H01L 27/3246* (2013.01); *H01L 51/5253* (2013.01); *H01L 51/5284* (2013.01)

(58) Field of Classification Search
CPC . H01L 27/14; H01L 27/146; H01L 27/14601; H01L 27/14603; H01L 27/14605; H01L 27/14607; H01L 27/1462; H01L 27/14621; H01L 27/14623; H01L 27/1463; H01L 27/14683; H01L 27/14685; H01L 27/32; H01L 27/3206; H01L 27/322; H01L 27/3225; H01L 27/323; H01L 27/3241; H01L 27/3246; H01L 27/326; H01L 33/44; H01L 33/46; H01L 33/52; H01L 33/58; H01L 33/60; H01L 51/52; H01L 51/5253; H01L 51/5256; H01L 51/5281; H01L 51/5284
See application file for complete search history.

(56) References Cited

U.S. PATENT DOCUMENTS 10,120,508 B2   11/2018   Cho et al.
2016/0170624 A1   6/2016   Zambetti et al.
(Continued)

FOREIGN PATENT DOCUMENTS

KR   10-2016-0088533 A   7/2016
KR   10-2017-011382 A   10/2017
(Continued)

*Primary Examiner* — Cheung Lee
(74) *Attorney, Agent, or Firm* — Innovation Counsel LLP

(57) ABSTRACT

A display device may include a display panel including a base layer, in which a display area with a central area and an edge area enclosing the central area is provided, a pixel definition layer having an opening, and an encapsulation layer covering the base layer, and an anti-reflection member including a light-blocking portion overlapping the pixel definition layer and a color filter portion overlapping the opening. The encapsulation layer may include a first portion overlapping the central area and a second portion overlapping the edge area and connected to the first portion. The light-blocking portion may include a first light-blocking pattern disposed on the first portion and covered with the color filter portion and a second light-blocking pattern disposed on the second portion and on the color filter portion.

20 Claims, 24 Drawing Sheets

(56) References Cited

U.S. PATENT DOCUMENTS

| | | |
|---|---|---|
| 2017/0278900 A1 | 9/2017 | Yang et al. |
| 2018/0095570 A1 | 4/2018 | Hong et al. |
| 2019/0165325 A1 | 5/2019 | Lee et al. |
| 2019/0243496 A1 | 8/2019 | Lee et al. |

FOREIGN PATENT DOCUMENTS

| | | |
|---|---|---|
| KR | 10-2018-0014229 A | 2/2018 |
| KR | 10-2018-0036847 A | 4/2018 |
| KR | 10-2019-0064709 A | 6/2019 |
| KR | 10-2019-0095633 A | 8/2019 |

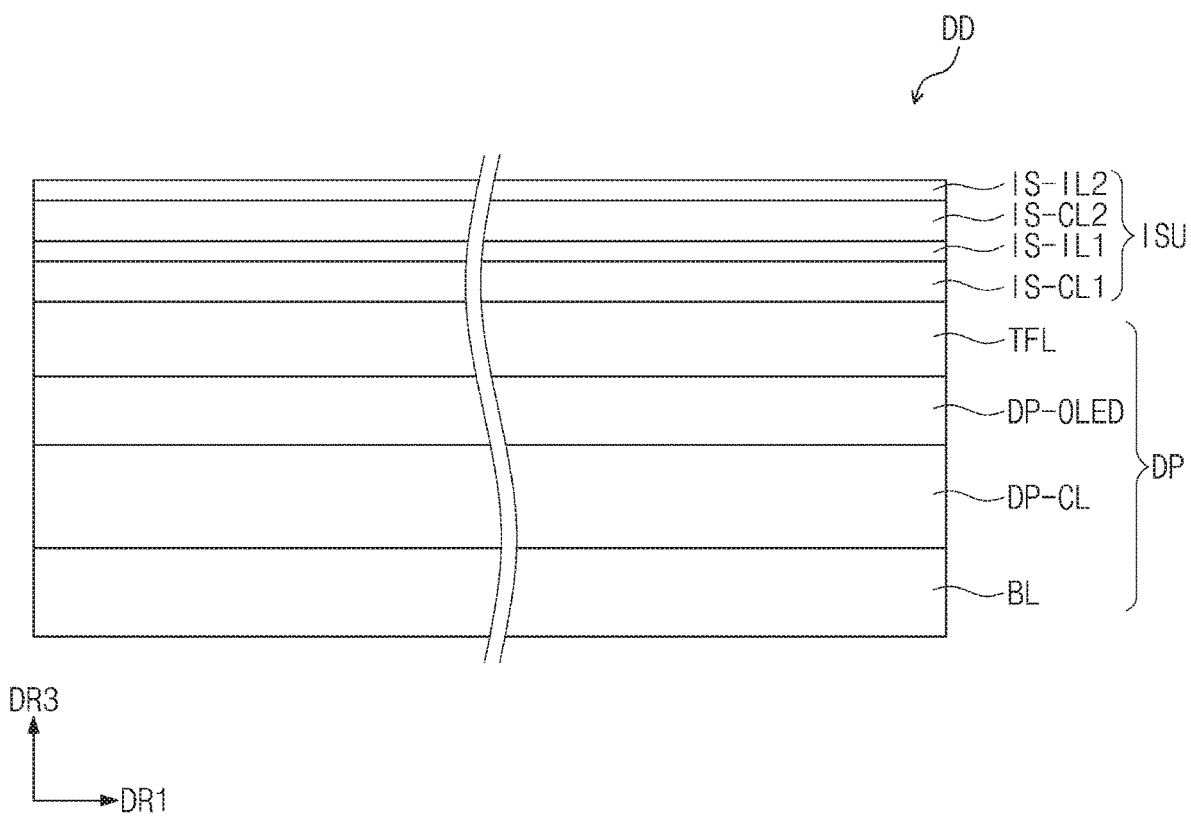

DISPLAY DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2018-0118735, filed on Oct. 5, 2018, in the Korean Intellectual Property Office, the disclosure of which is hereby incorporated by reference in its entirety.

BACKGROUND OF THE INVENTION

The present disclosure relates to a display device with improved reliability. Furthermore, the present disclosure relates to a method of cost-effectively fabricating a display device.

There have been developed various flat panel display devices, such as liquid crystal display (LCD), organic light emitting display (OLED), plasma display panel (PDP), quantum dot display, field emission display (FED), and electrophoretic display (EPD) devices. Each of the flat panel display devices include a flat display panel that is used to display an image. The flat display panel typically includes a pair of combined transparent insulating substrates, with an intervening layer (e.g., a light-emitting layer, a polarization layer, or an optical layer) therebetween.

The OLED device includes a self-luminous organic light emitting diode that is disposed in each sub pixel and is used to display an image. Since the OLED device does not require an additional light source and a structure for mounting the light source to the display panel, the OLED device may be made to have a small thickness and light weight. Due to these size and weight advantages, the OLED device is emerging as a next-generation display device. Meanwhile, the OLED device may include reflective metal patterns that deteriorate an external light reflection property of the OLED device. To avoid the deterioration of the external light reflection property, a polarization plate may be further provided in the OLED device. However, in general, the polarization plate has a large thickness (e.g., about 150 µm or larger) and is expensive. Furthermore, it may cause deterioration in the transmittance of the OLED device.

SUMMARY

An embodiment of the inventive concept provides a display device that includes an anti-reflection member imparting an improved reliability property.

An embodiment of the inventive concept provides a method of cost-effectively fabricating a display device.

According to an embodiment of the inventive concept, a display device may include a display panel including a base layer, a pixel definition layer, a light emitting device, and an encapsulation layer, the base layer including a display area including a central area and an edge area that encloses the central area and a non-display area adjacent to the display area, the pixel definition layer being disposed in the display area and having an opening, the light emitting device emitting light through the opening, and the encapsulation layer covering the pixel definition layer and the light emitting device and including a first portion overlapping the central area and a second portion overlapping the edge area and connected to the first portion, an input-sensor including conductive patterns that are not overlapping the opening and are disposed at different levels on the display panel, and an insulating layer that is disposed between the conductive patterns, and an anti-reflection member disposed on the input-sensor. The anti-reflection member may include a light-blocking portion overlapping the pixel definition layer and a color filter portion overlapping the opening. The light-blocking portion may include a first light-blocking pattern disposed on the first portion and covered with the color filter portion, and a second light-blocking pattern disposed on the second portion and on the color filter portion.

In an embodiment, a first thickness of the first portion may be larger than a second thickness of the second portion.

In an embodiment, when measured in a thickness direction of the display panel, a distance from a top surface of the base layer to the first light-blocking pattern may be substantially same as a distance from the top surface of the base layer to the second light-blocking pattern.

In an embodiment, a plurality of opening may be provided, and the color filter portion may include a first color pattern, a second color pattern, and a third color pattern that overlap respective ones of the plurality of openings and have different colors from each other, and a partition pattern that is disposed in the edge area and overlaps the pixel definition layer. The partition pattern may have a substantially same color as the first color pattern.

In an embodiment, in the central area, the first color pattern, the second color pattern, and the third color pattern may be arranged next to one another in sequence, and in the edge area, the second color pattern and the third color pattern may be spaced apart from each other with the partition wall member interposed therebetween.

In an embodiment, the first color pattern on the edge area may be connected to the partition pattern.

In an embodiment, the second light-blocking pattern may include a first light-blocking layer and a second light-blocking layer containing same materials as the second color pattern and the third color pattern, respectively, and each of the first light-blocking layer and the second light-blocking layer may be disposed on and overlap the partition pattern.

In an embodiment, one color pattern of the first color pattern, the second color pattern, and the third color pattern that overlaps the edge area and is closest to the non-display area may include a recessed area. A third thickness of a portion of the one color pattern overlapping the recessed area may be substantially same as a fourth thickness of another color pattern adjacent thereto.

According to an embodiment of the inventive concept, a display device may include a display panel including a base layer, a pixel definition layer, a light emitting device, and an encapsulation layer, the base layer including a display area including a central area and an edge area that encloses the central area and a non-display area adjacent to the display area, the pixel definition layer being disposed in the display area and having an opening, the light emitting device emitting light through the opening, and the encapsulation layer covering the pixel definition layer and the light emitting device and including a first portion overlapping the central area and a second portion overlapping the edge area and connected to the first portion, an input-sensor including conductive patterns that do not overlap the opening and are disposed at different levels on the display panel, and an insulating layer that is disposed between the conductive patterns, and an anti-reflection member disposed on the input-sensor. The anti-reflection member may include a light-blocking portion overlapping the pixel definition layer and a color filter portion overlapping the opening. The light-blocking portion may include a first light-blocking pattern that overlaps the first portion and is covered with the color filter portion, and a second light-blocking pattern that overlaps the second portion and is disposed on the color filter portion. When measured in a thickness direction of the display panel, a distance from a top surface of the base layer to the first light-blocking pattern may be substantially same as a distance from the top surface of the base layer to the second light-blocking pattern.

In an embodiment, a first thickness of the first portion may be larger than a second thickness of the second portion.

In an embodiment, a plurality of opening may be provided. The color filter portion may include a first color pattern, a second color pattern, and a third color pattern that overlap respective ones of the plurality of openings and have different colors from each other, and a partition pattern that is disposed in the edge area and overlaps the pixel definition layer. The partition pattern may have a substantially same color as the first color pattern.

In an embodiment, the first light-blocking pattern may be covered with first color pattern, second color pattern, and the third color pattern disposed in the central area, and the second light-blocking pattern may be disposed on the partition pattern.

In an embodiment, the second light-blocking pattern may include a first light-blocking layer and a second light-blocking layer that are stacked in sequence. The first light-blocking layer may have a same color as the second color pattern, and the second light-blocking layer may have a same color as the third color pattern.

In an embodiment, a plurality of second light-blocking patterns may be provided, and a distance between adjacent ones of the plurality of second light-blocking patterns may be larger than a largest distance between adjacent ones of the plurality of openings.

In an embodiment, in the central area, the first color pattern, the second color pattern, and the third color pattern may be arranged next to one another in sequence. In the edge area, the second color pattern and the third color pattern may be spaced apart from each other with the partition wall member interposed therebetween.

In an embodiment, a third thickness of the partition pattern may be substantially same as a fourth thickness of a portion of the first color pattern overlapping the second portion.

According to an embodiment of the inventive concept, a method of fabricating a display device may include providing a preliminary display panel including a base layer, a pixel definition layer, and light emitting devices, the base layer including a central area and an edge area that encloses the central area, the pixel definition layer being formed on the base layer and having a plurality of openings, and each of the light emitting devices emitting light through a corresponding one of the plurality of openings, forming an encapsulation layer to cover the base layer, the encapsulation layer containing a first organic material, providing a second organic material using a first mask to form a light-blocking pattern on the pixel definition layer formed in the central area, the second organic material containing an optically opaque material, providing a third organic material using a second mask to form a first color pattern that overlaps at least one of the plurality of openings formed in each of the central area and the edge area, and a partition pattern that overlaps the pixel definition layer formed in the edge area, providing a fourth organic material using a third mask to form a second color pattern that is spaced apart from the first color pattern and overlaps at least one of the plurality of openings formed in each of the central area and the edge area, and a first light-blocking layer that is provided on the partition pattern, the fourth organic material having a different color from the third organic material, and providing a fifth organic material using a fourth mask to form a third color pattern that is spaced apart from the second color pattern and overlaps at least one of the plurality of openings formed in each of the central area and the edge area, and a second light-blocking layer that is provided on the first light-blocking layer, the fifth organic material having a different color from the third organic material and the fourth organic material.

In an embodiment, the first color pattern, the second color pattern, and the third color pattern may be formed to cover the light-blocking pattern.

In an embodiment, the first color pattern and the partition pattern in the edge area may be simultaneously formed as a single-connected pattern.

In an embodiment, the method may further include directly forming an input-sensor including conductive patterns on the encapsulation layer. The input-sensor may overlap the pixel definition layer without overlapping the plurality of openings.

BRIEF DESCRIPTION OF THE DRAWINGS

Example embodiments of the present disclosure will be more clearly understood from the following brief description taken in conjunction with the accompanying drawings. The accompanying drawings represent non-limiting, example embodiments as described herein.

FIG. 4A is a sectional view illustrating a display device according to an embodiment of the inventive concept.

Figure 1A:
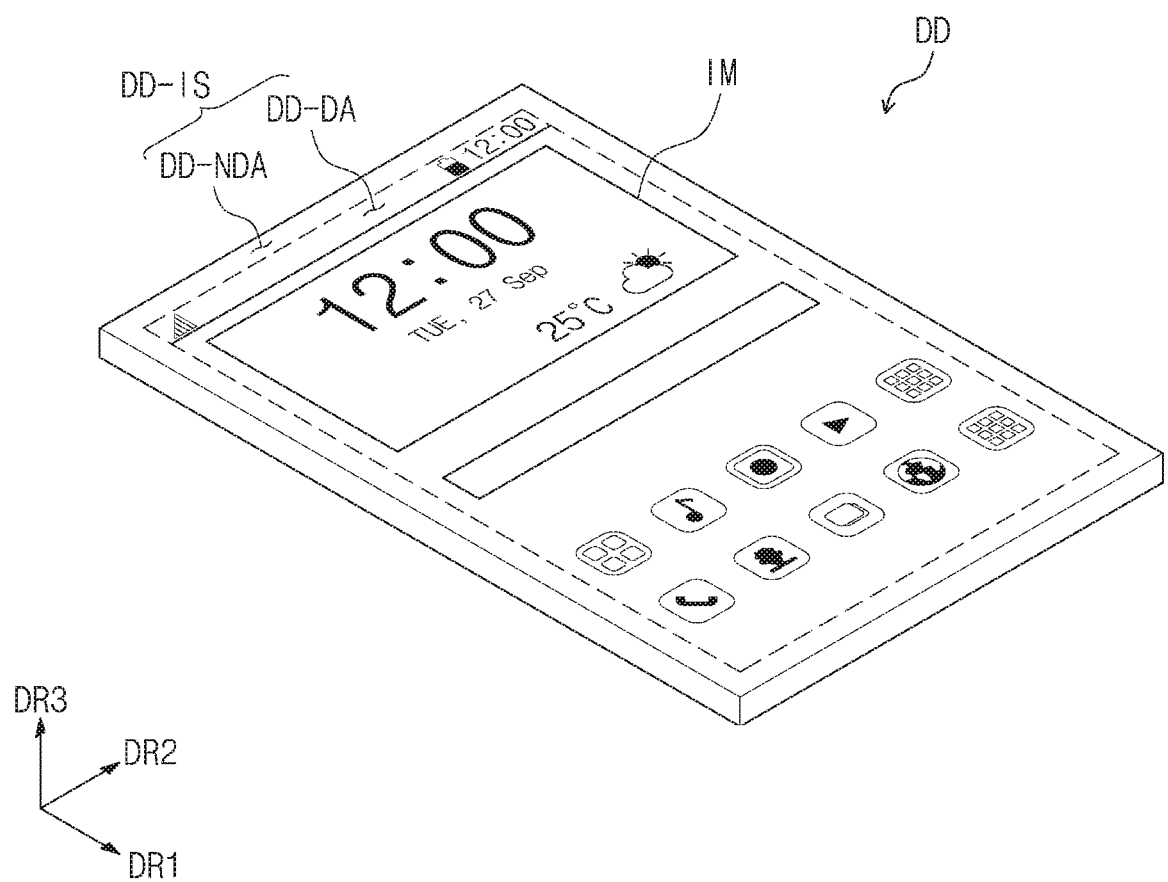
FIG. 1A is a perspective view illustrating a display device according to an embodiment of the inventive concept.

It should be noted that these figures are intended to illustrate the general characteristics of methods, structure, and/or materials utilized in certain example embodiments and to supplement the written description provided below. These drawings are not, however, to scale and may not precisely reflect the structural or performance characteristics of any given embodiment, and should not be interpreted as defining or limiting a range of values or properties encompassed by the example embodiments. For example, the relative thicknesses and positioning of molecules, layers, areas, and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the example embodiments set forth herein; rather, these example embodiments are provided so that the present disclosure will be thorough and complete, and will fully convey the concept of the example embodiments to those of ordinary skill in the art. In the drawings, the thicknesses of layers and areas are exaggerated for clarity. Like reference numerals in the drawings denote like elements, and thus their repeated description will be omitted.

It will be understood that when an element is referred to as being "connected" or "coupled" to another element, it can be directly connected or coupled to the other element or one or more intervening elements may be present therebetween. In contrast, when an element is referred to as being "directly connected" or "directly coupled" to another element, there may be no intervening elements present. Like numbers indicate like elements throughout the present disclosure. As used herein the term "and/or" includes any and all combinations of one or more of the associated listed items. Other words used to describe a relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, areas, layers, and/or sections, these elements, components, areas, layers, and/or sections should not be limited by these terms. These terms are only used to distinguish one element, component, area, layer, or section from another element, component, area, layer, or section. Thus, a first element, component, area, layer, or section discussed below could be termed a second element, component, area, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein may be interpreted accordingly.

The terminology used herein is for the purpose of describing particular embodiments only and is not intended to be limiting of example embodiments. As used herein, the singular forms "a," "an," and "the" are intended to include a plural form as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments of the inventive concept may be described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of areas illustrated herein but are to include deviations in shapes that may result, for example, from manufacturing.

Unless otherwise defined, all terms (including technical and scientific terms) used herein have the same meaning as commonly understood by one of ordinary skill in the art to which example embodiments of the inventive concept pertain. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
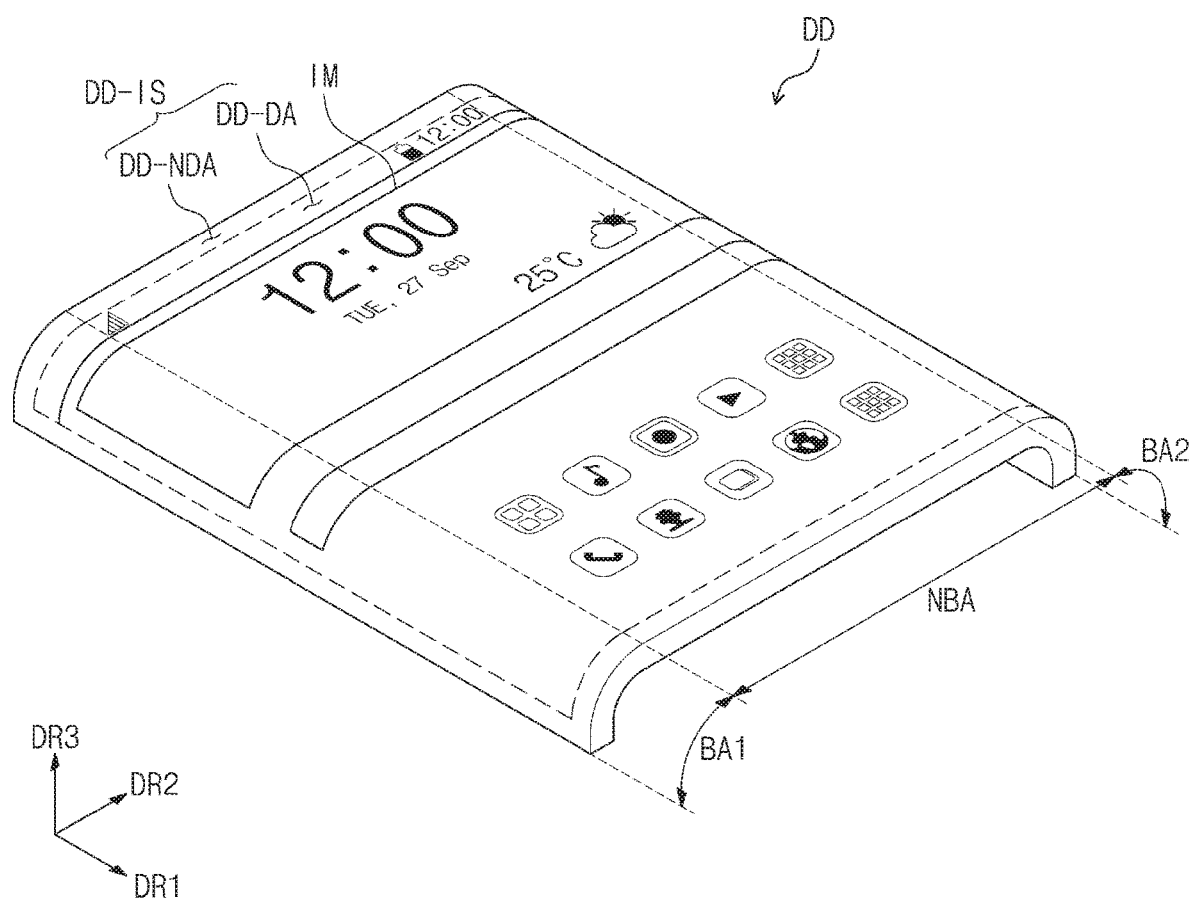
FIG. 1B is a perspective view illustrating a display device according to another embodiment of the inventive concept.

FIG. 1A is a perspective view illustrating a display device according to an embodiment of the inventive concept. FIG. 1B is a perspective view illustrating a display device according to another embodiment of the inventive concept.

Referring to FIG. 1A, a display device DD may include a display surface DD-IS that is used to display an image IM. The display surface DD-IS may be defined by a first direction DR1 and a second direction DR2. A normal direction of the display surface DD-IS (i.e., a thickness direction of the display device DD) will be referred to as a third direction DR3.

The display device DD according to the present embodiment may be a rigid display device. A cellphone terminal is exemplarily illustrated in FIG. 1A as an example of the display device DD. Although not shown, the cellphone terminal may further include an electronic module, a camera module, a power module, and so forth that are mounted on a mainboard and are provided in a bracket or a case, along with the display device DD. In other examples, the display device DD may be used for large-sized electronic devices (e.g., televisions and monitors) or small- or medium-sized electronic devices (e.g., tablets, car navigation systems, game machines, and smart watches).

As shown in FIG. 1A, the display device DD may include an active area DD-DA of a rectangular shape. The display device DD may further include a non-active area DD-NDA enclosing the active area DD-DA. However, the inventive concept is not limited to this example, and in other embodiments, shapes of the active and non-active areas DD-DA and DD-NDA may be variously changed in a complementary manner.

Referring to FIG. 1B, the display device DD may be a flexible display device, unlike that shown in FIG. 1A. The display device DD may include two bending areas BA1 and BA2 and a non-bending area NBA. For example, the display device DD may include first and second bending areas BA1 and BA2 that are respectively extended from opposite sides of the non-bending area NBA and are spaced apart from each other in the second direction DR2 with the non-bending area NBA interposed therebetween. The first and second bending areas BA1 and BA2 may be configured to be bendable along their respective bending axes parallel to the first direction. Meanwhile, some embodiments, each of which is applicable to a rigid or flexible display device, will be described to clarify the inventive concept, but the inventive concept is not limited to the example embodiments to be described below.

Figure 2:
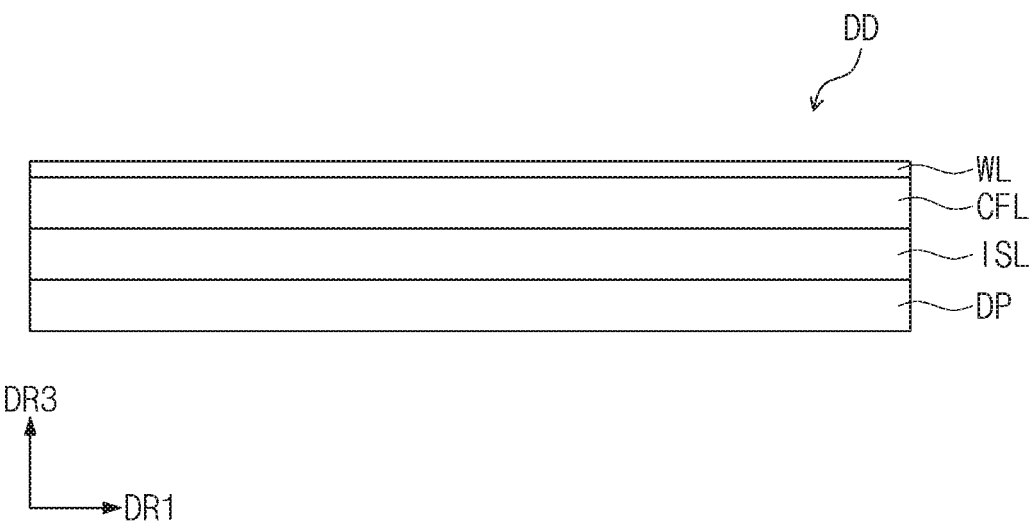
FIG. 2 is a sectional view illustrating a display device according to an embodiment of the inventive concept.
Figure 3A:
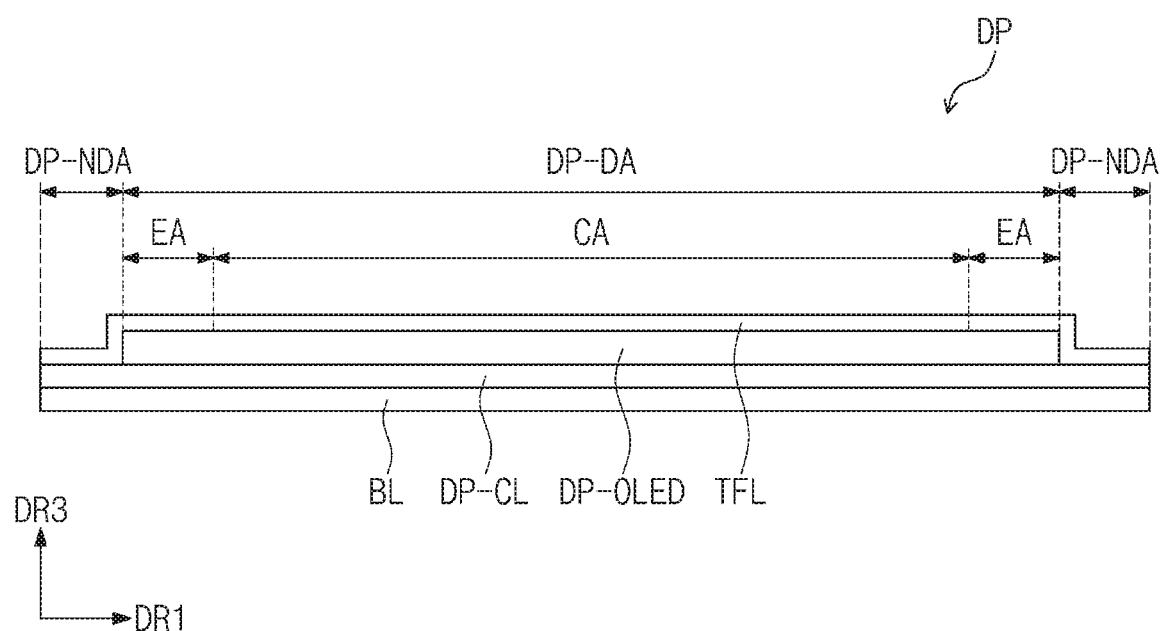
FIG. 3A is a sectional view illustrating a display module according to an embodiment of the inventive concept.
Figure 3B:
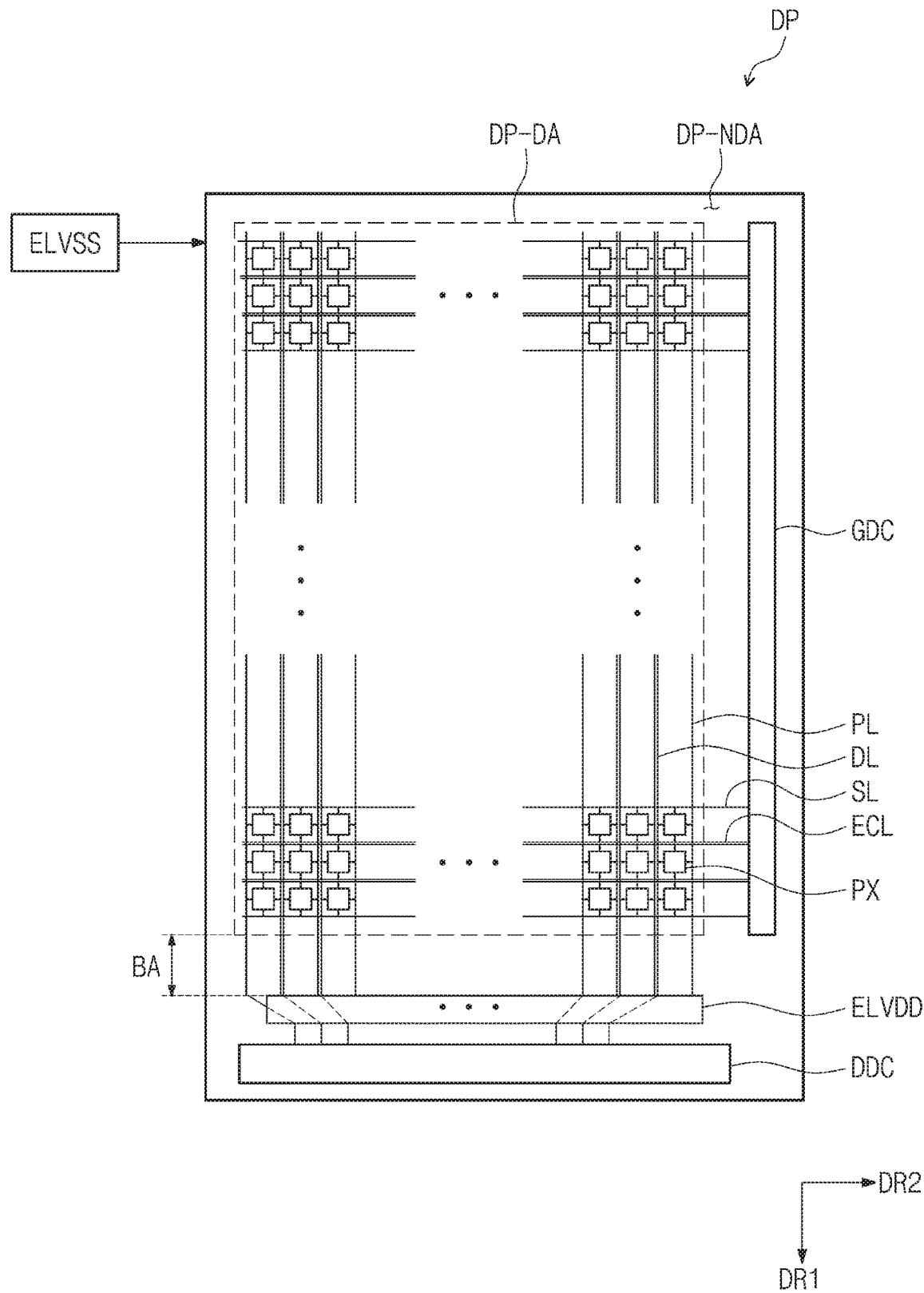
FIG. 3B is a plan view illustrating a display panel according to an embodiment of the inventive concept.
Figure 3C:
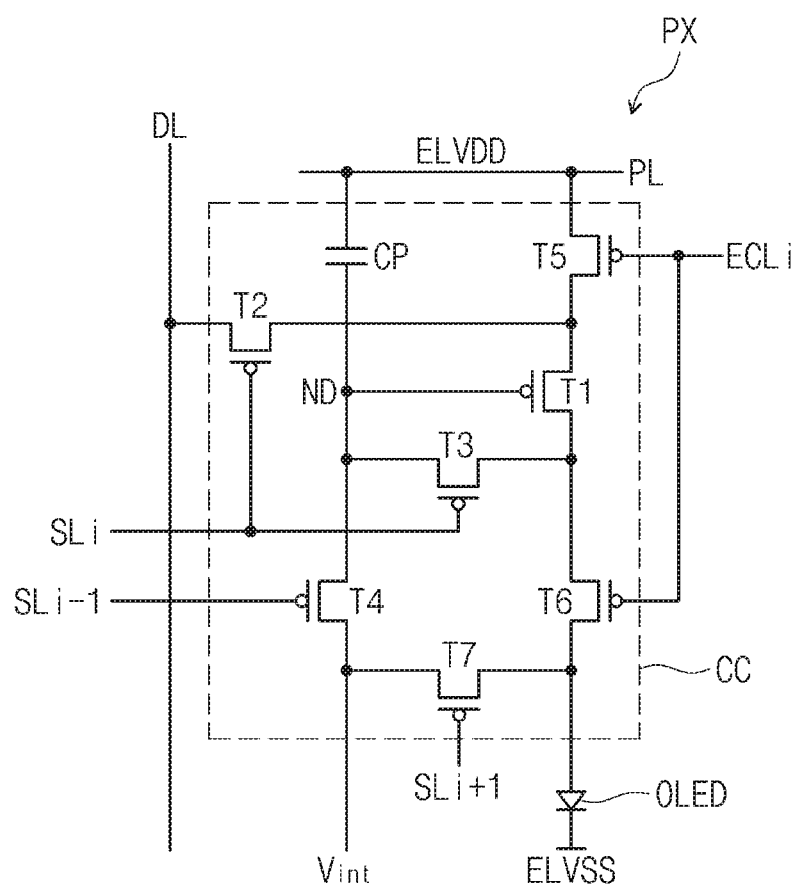
FIG. 3C is an equivalent circuit diagram illustrating a pixel according to an embodiment of the inventive concept.
Figure 3D:
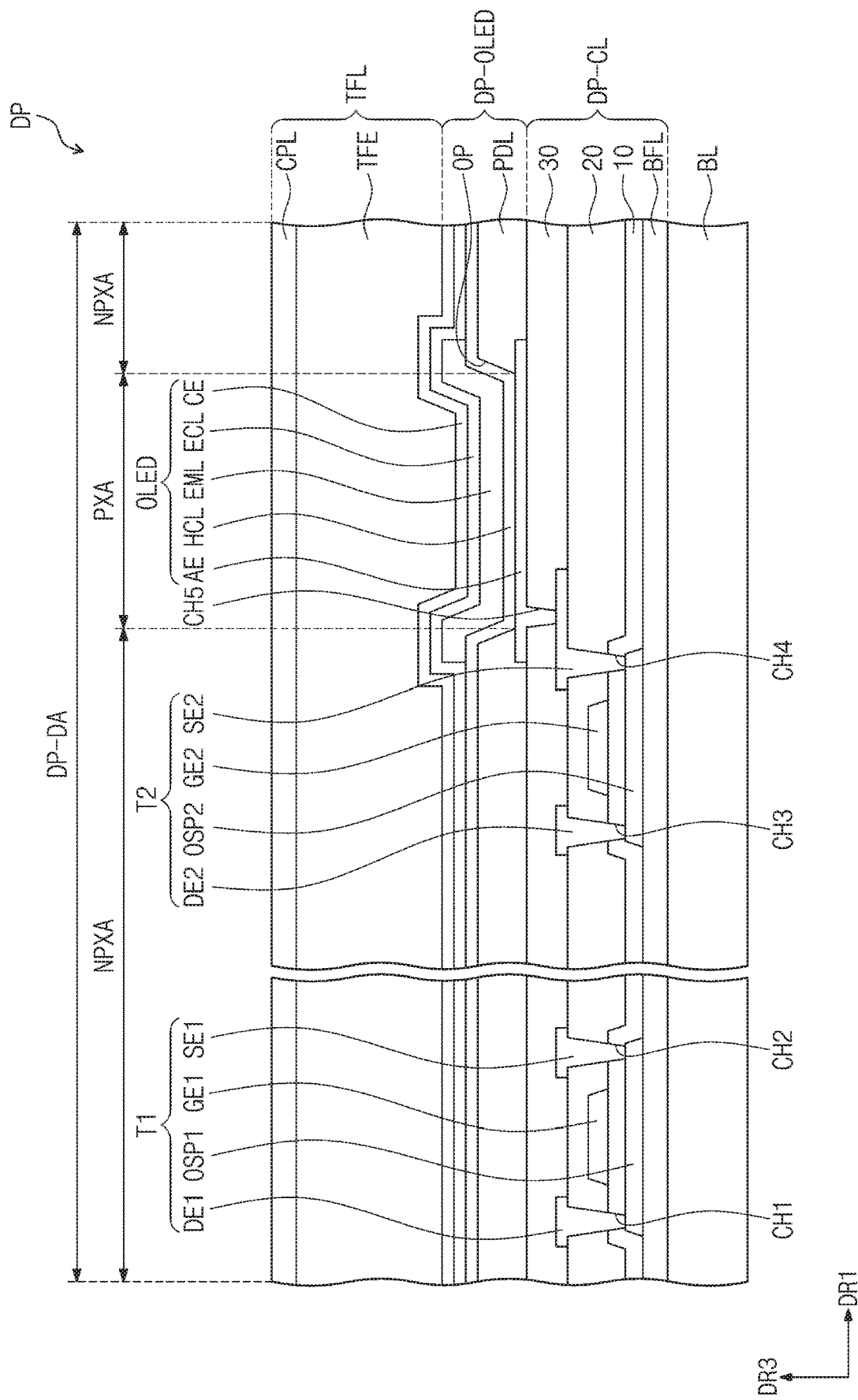
FIG. 3D is an enlarged sectional view of a display panel according to an embodiment of the inventive concept.

FIG. 2 is a sectional view illustrating a display device according to an embodiment of the inventive concept. FIG. 3A is a sectional view illustrating a display module according to an embodiment of the inventive concept. FIG. 3B is a plan view illustrating a display panel according to an embodiment of the inventive concept. FIG. 3C is an equivalent circuit diagram illustrating a pixel according to an embodiment of the inventive concept. FIG. 3D is an enlarged sectional view of a display panel according to an embodiment of the inventive concept. Hereinafter, the display panel will be described with reference to FIGS. 2 and 3A to 3D.

Referring to FIG. 2, the display device DD may include a display panel DP, an input-sensor ISL, an anti-reflection member CFL, and a window layer WL.

In an embodiment, the input-sensor ISL may be directly disposed on the display panel DP. In the present specification, the expression "an element B may be directly disposed on an element A" means that an adhesive layer/member may not be disposed between the elements A and B. The element B may be formed on a surface of the element A, directly after the element A is formed.

The display panel DP may generate an image, and the input-sensor ISL may obtain information on coordinates of an external input. The external input may be provided in various manners. For example, the input-sensor ISL may be configured to sense a touching-type external input, such as a user's body or hand, and a non-touching-type external input, such as a reduction in distance from the display device DD or a hovering event near the display device DD. In addition, the input-sensor ISL may be configured to sense a change in physical characteristics (e.g., force, pressure, and/or light intensity) of an external input, but the inventive concept is not limited to a specific embodiment.

Although not shown, a protection member may be further disposed on a bottom surface of the display panel DP. The protection member and the display panel DP may be combined to each other by an adhesive member.

In an embodiment, the display panel DP may be a light emitting type display panel, but the inventive concept is not limited to a specific type of the display panel DP. For example, the display panel DP may be an organic light emitting display panel or a quantum dot light emitting display panel. A light emitting layer of the organic light emitting display panel may be formed of or include an organic luminescent material. A light emitting layer of the quantum dot light emitting display panel may include quantum dots and/or quantum rods. The following description will refer to an example in which the display panel DP is the organic light emitting display panel, but the inventive concept is not limited to a specific embodiment.

The anti-reflection member CFL may be disposed on the input-sensor ISL. The anti-reflection member CFL may reduce reflectance of an external light that is incident through a top surface of the window layer WL.

The window layer WL may include a glass substrate, a synthetic resin film, or the like. The window layer WL may have a single-layered structure as shown in FIG. 2B or may include a plurality of layers combined to each other by an adhesive member, but the inventive concept is not limited to a specific example. Although not shown, the window layer WL may further include a coating layer that is used as a top layer thereof. The coating layer may include at least one of an anti-fingerprint layer, an anti-reflection layer, and a hard coating layer.

Referring to FIG. 3A, the display panel DP may include a base layer BL, a circuit device layer DP-CL, a display element layer DP-OLED, and an upper insulating layer TFL.

In an embodiment, a display area DP-DA may include a central area CA and an edge area EA. The edge area EA may enclose the central area CA. Thus, the central area CA may be spaced apart from a non-display area DP-NDA with the edge area EA interposed therebetween. The display area DP-DA and the non-display area DP-NDA of the display panel DP may respectively correspond to the active area DD-DA and the non-active area DD-NDA of the display device DD as shown in FIGS. 1A and 1B.

The edge area EA may be defined as an area that is distant from a center of the display panel DP compared with the central area CA. The edge area EA may be an area including the bending areas BA1 and BA2 shown in FIG. 1B. Hereinafter, the display area DP-DA will be described as an area defined on the base layer BL of the display panel DP.

The base layer BL may be a layer, on which other elements of the display panel DP are provided. The base layer BL may include a synthetic resin layer. For example, the base layer BL may be formed by forming a synthetic resin layer on a working substrate that is used to fabricate the display panel DP, forming conductive and insulating layers on the synthetic resin layer, and then removing the working substrate to obtain the synthetic resin layer serving as the base layer BL. In an embodiment, the synthetic resin layer may be a flexible polyimide resin layer. In certain embodiments, the base layer BL may include a rigid glass substrate, a metal substrate, or a substrate made of an organic/inorganic composite material, but the inventive concept is not limited to a specific embodiment.

The circuit device layer DP-CL may be disposed on the base layer BL. The circuit device layer DP-CL may include at least one insulating layer and a circuit device. Hereinafter, the insulating layer in the circuit device layer DP-CL may also be referred to as an intermediate insulating layer. The intermediate insulating layer may include at least one intermediate inorganic layer and/or at least one intermediate organic layer. The circuit device may include signal lines, pixel driving circuits, and so forth. The circuit device layer DP-CL may be formed by forming an insulating layer, a semiconductor layer, and a conductive layer using a coating or deposition process and then patterning the insulating layer, the semiconductor layer, and the conductive layer using a photolithography process.

The display element layer DP-OLED may be disposed on the circuit device layer DP-CL and may be electrically connected to the circuit device layer DP-CL. The display element layer DP-OLED may include a light emitting element. The display element layer DP-OLED may include light emitting devices that are used as the light emitting element. The display element layer DP-OLED may further include an organic layer (e.g., a pixel definition layer).

The upper insulating layer TFL may be disposed on the display element layer DP-OLED. The upper insulating layer TFL may include an encapsulation layer covering the circuit device layer DP-CL as will be described below. The upper insulating layer TFL may include one or more layers such as a capping layer and/or a refractive index control layer.

Referring to FIG. 3B, the base layer BL of the display panel DP may include the display area DP-DA and the non-display area DP-NDA when viewed in a plan view. In the present embodiment, the non-display area DP-NDA may be defined along a border of the display area DP-DA. The display area DP-DA and the non-display area DP-NDA of the display panel DP may respectively correspond to the active area DD-DA and the non-active area DD-NDA of the display device DD as shown in FIGS. 1A and 1B.

The display panel DP may include a scan driver GDC, a data driver DDC, a plurality of scan lines SL, a plurality of emission control lines ECL, a plurality of data lines DL, and a plurality of power lines PL, and a plurality of pixels PX. The pixels PX may be disposed in the display area DP-DA. Each of the pixels PX may include a light emitting device OLED and a pixel circuit CC connected thereto (e.g., see FIG. 3C).

The scan driver GDC may include a scan control driver and an emission control driver. The scan control driver may generate scan signals and output the generated scan signals sequentially to the scan lines SL. The emission control driver may generate emission control signals and output the generated emission control signals to the emission control lines ECL. In certain embodiments, the scan control driver and the emission control driver may be provided as a single circuit, not as separate elements, in the scan driver GDC.

The scan driver GDC may include a plurality of thin-film transistors that are formed by the same process as that for forming the pixel circuit CC of the pixel PX (e.g., by a low temperature polycrystalline silicon (LTPS) process or a low temperature polycrystalline oxide (LTPO) process).

The data driver DDC may output data signals to the data lines DL. The data signals may be provided in the form of analog voltages, whose levels are determined based on gradation levels of an image data.

In an embodiment, the data driver DDC may be directly mounted on the display panel DP, but the inventive concept is not limited to this example. For example, in certain embodiments, the data driver DDC may be mounted on a printed circuit board (not shown) that is electrically connected to end portions (e.g., pads) of the data lines DL.

The scan lines SL may extend in the second direction DR2 and may be arranged in the first direction DR1 crossing the second direction DR2. In an embodiment, the second direction DR2 and the first direction DR1 may be perpendicular to each other, but the inventive concept is not limited thereto.

The emission control lines ECL may extend in the second direction DR2 and may be arranged in the first direction DR1. In other words, each of the emission control lines ECL may be arranged to be parallel to a corresponding one of the scan lines SL.

The data lines DL may extend in the first direction DR1 and may be arranged in the second direction DR2. The data lines DL may provide the data signals to corresponding ones of the pixels PX.

The power lines PL may extend in the first direction DR1 and may be arranged in the second direction DR2. Each of the power lines PL may provide a first power ELVDD to corresponding ones of the pixels PX.

Each of the pixels PX may be coupled to a corresponding one of the scan lines SL, a corresponding one of the emission control lines ECL, a corresponding one of the data lines DL, and a corresponding one of the power lines PL.

The non-display area DP-NDA of the display panel DP may include a bending area BA. In this case where the bending area BA of the display panel DP is bent, an area of the non-display area DP-NDA may be decreased, when viewed in a plan view defined by the first and second directions DR1 and DR2 reducing an area of a bezel area of the display device DD. For example, it may be possible to reduce an area of the non-active area DD-NDA of the display device DD as shown in FIG. 1B.

Referring to FIG. 3C, each of the pixels PX may include a light emitting device OLED and a pixel circuit CC. The pixel circuit CC may include a plurality of transistors T1-T7 and a capacitor CP. The pixel circuit CC may control timing and an amount of current flowing through the organic light emitting device OLED in response to a data signal received from the data line DL.

The light emitting device OLED may emit light, whose brightness is determined by an amount of current supplied from the pixel circuit CC. The first power ELVDD may be set to a level higher than that of a second power ELVSS.

Each of the transistors T1-T7 may include an input or source electrode, an output or drain electrode, and a control or gate electrode. In the present specification, for convenience in description, one of the input and output electrodes may be referred to as "a first electrode", and the other may be referred to as "a second electrode".

The first electrode of the first transistor T1 may be coupled to the first power ELVDD through the fifth transistor T5, and the second electrode may be coupled to an anode electrode of the light emitting device OLED through the sixth transistor T6. In the present specification, the first transistor T1 may be referred to as "a driving transistor".

The first transistor T1 may control an amount of current flowing through the light emitting device OLED in response to a voltage applied to the control electrode.

The second transistor T2 may be coupled between the data line DL and the first electrode of the first transistor T1. The control electrode of the second transistor T2 may be coupled to an i-th scan line SLi. When the i-th scan signal Si is provided to the i-th scan line SLi, the second transistor T2 may be turned on to provide a data signal of the data line DL to the first electrode of the first transistor T1.

The third transistor T3 may be coupled between the second electrode and the control electrode of the first transistor T1. The control electrode of the third transistor T3 may be coupled to the i-th scan line SLi. When the i-th scan signal Si is provided to the i-th scan line SLi, the third transistor T3 may be turned on to electrically couple the second electrode and the control electrode of the first transistor T1 to each other. Thus, when the third transistor T3 is turned on, the first transistor T1 may behave like a diode.

The fourth transistor T4 may be coupled between a node ND and an initialization power generator (not shown). The control electrode of the fourth transistor T4 may be coupled to an (i−1)-th scan line SLi−1. When an (i−1)-th scan signal Si−1 is provided to the (i−1)-th scan line SLi−1, the fourth transistor T4 may be turned on to provide an initialization voltage Vint to the node ND.

The fifth transistor T5 may be coupled between the power line PL and the first electrode of the first transistor T1. The control electrode of the fifth transistor T5 may be coupled to an i-th emission control line ECLi.

The sixth transistor T6 may be coupled between the second electrode of the first transistor T1 and the anode electrode of the light emitting device OLED. The control electrode of the sixth transistor T6 may be coupled to the i-th emission control line ECLi.

The seventh transistor T7 may be coupled between the initialization power generator (not shown) and the anode electrode of the light emitting device OLED. The control electrode of the seventh transistor T7 may be coupled to an (i+1)-th scan line SLi+1. When an (i+1)-th scan signal Si+1 is provided to the (i+1)-th scan line SLi+1, the seventh transistor T7 may be turned on to provide the initialization voltage Vint to the anode electrode of the light emitting device OLED.

The seventh transistor T7 may improve a black representation capability of the pixel PX. When the seventh transistor T7 is turned on, a parasitic capacitor (not shown) of the light emitting device OLED may be discharged. In this case, the pixel PX may precisely represent black by preventing light from being emitted from the light emitting device OLED despite a leakage current from the first transistor T1 and thereby to improve the black representation capability of the pixel PX.

In addition, although FIG. 3C illustrates an example in which the control electrode of the seventh transistor T7 is coupled to the (i+1)-th scan line SLi+1, the inventive concept is not limited to this example. In certain embodiments, the control electrode of the seventh transistor T7 may be coupled to the i-th scan line SLi or the (i−1)-th scan line SLi−1.

FIG. 3C illustrates an example in which PMOS transistors are used as the transistors T1-T7, but the inventive concept is not limited to this example. In certain embodiments, n-type Metal Oxide Semiconductor Field Effect Transistor (MOSFET) (NMOS) transistors may be used to form the pixel PX. In other embodiments, the pixel PX may be configured to include not only NMOS transistors but also p-type MOSFET (PMOS) transistors.

The capacitor CP may be provided between the power line PL and the node ND. The capacitor CP may be charged to a voltage level corresponding to the data signal. When the fifth and sixth transistors T5 and T6 are turned on, an amount of current flowing through the first transistor T1 may be determined depending on the voltage level of the capacitor CP.

The inventive concept is not limited to the structure of the pixel PX shown in FIG. 3C. In certain embodiments, the circuit structure of the pixel PX may be variously changed to control the light emitting operation of the light emitting device OLED.

FIG. 3D illustrates a vertical section of a portion of the display panel DP, in which some elements of the pixels PX of FIG. 3C are disposedly shown.

In an embodiment, the display area DP-DA may include a light-emitting area PXA and a non-light-emitting area NPXA adjacent to the light-emitting area PXA. When viewed in a plan view, the non-light-emitting area NPXA may enclose the light-emitting area PXA.

The base layer BL may be flexible or rigid, but the inventive concept is not limited to a specific embodiment. The circuit device layer DP-CL, the display element layer DP-OLED, and an upper insulating layer TFL may be sequentially stacked on the base layer BL. In the present embodiment, the circuit device layer DP-CL may include a buffer layer BFL, a first intermediate inorganic layer 10, and a second intermediate inorganic layer 20 that are formed of inorganic materials, and an intermediate organic layer 30 that is formed of an organic material. The inventive concept is not limited to the particular materials of the inorganic and organic layers, and the buffer layer BFL may be disposed or omitted depending on a structure of the circuit device layer DP-CL.

A semiconductor pattern OSP1 (hereinafter, a first semiconductor pattern) of the first transistor T1 and a semiconductor pattern OSP2 (hereinafter, a second semiconductor pattern) of the second transistor T2 may be disposed on the buffer layer BFL. Each of the first and second semiconductor patterns OSP1 and OSP2 may be formed of or include a semiconductor material. For example, each of the first and second semiconductor patterns OSP1 and OSP2 may be formed of or include at least one of amorphous silicon, poly silicon, and metal oxide semiconductor materials.

The first intermediate inorganic layer 10 may be disposed on the first and second semiconductor patterns OSP1 and OSP2. A control electrode GE1 (hereinafter, a first control electrode) of the first transistor T1 and a control electrode GE2 (hereinafter, a second control electrode) of the second transistor T2 may be disposed on the first intermediate inorganic layer 10.

The second intermediate inorganic layer 20 may be disposed on the first intermediate inorganic layer 10 to cover the first control electrode GE1 and the second control electrode GE2. An input electrode DE1 and an output electrode SE1 (hereinafter, a first input electrode and a first output electrode) of the first transistor T1 and an input electrode DE2 and an output electrode SE2 (hereinafter, a second input electrode and a second output electrode) of the second transistor T2 may be disposed on the second intermediate inorganic layer 20.

The first input electrode DE1 and the first output electrode SE1 may be respectively connected to the first semiconductor pattern OSP1 through a first penetration hole CH1 and a second penetration hole CH2 that are formed to penetrate through the first intermediate inorganic layer 10 and the second intermediate inorganic layer 20. Similarly, the second input electrode DE2 and the second output electrode SE2 may be respectively connected to the second semiconductor pattern OSP2 through a third penetration hole CH3 and a fourth penetration hole CH4 that are formed to penetrate through the first intermediate inorganic layer 10 and the second intermediate inorganic layer 20.

In the meantime, the inventive concept is not limited to the illustrated structures of the first and second transistors T1 and T2, and the structures of the first and second transistors T1 and T2 may be variously changed. For example, at least one of the first and second control electrodes GE1 and GE2 may be disposed below the corresponding semiconductor pattern. In certain embodiments, at least one of the first and second output electrodes SE1 and SE2 and the first and second input electrodes DE1 and DE2 may be directly coupled to the corresponding semiconductor pattern not via the penetration holes CH1 to CH4. In certain embodiments, the first and second transistors T1 and T2 may have different structures.

The intermediate organic layer 30 may be disposed on the second intermediate inorganic layer 20. The intermediate organic layer 30 may cover the first input electrode DE1, the second input electrode DE2, the first output electrode SE1, and the second output electrode SE2. The intermediate organic layer 30 may be disposed to have a flat surface.

The display element layer DP-OLED may be disposed on the intermediate organic layer 30. The display element layer DP-OLED may further include a pixel definition layer PDL in addition to the light emitting device OLED.

A first electrode AE may be disposed on the intermediate organic layer 30. The first electrode AE may be connected to the second output electrode SE2 through a fifth penetration hole CH5 penetrating through the intermediate organic layer 30. An opening OP may be defined in the pixel definition layer PDL. The opening OP of the pixel definition layer PDL may be formed to expose at least a portion of the first electrode AE.

A hole control layer HCL may be disposed in the light-emitting area PXA and extend to the non-light-emitting area NPXA. Although not shown, a common layer (e.g., the hole control layer HCL) may be formed in common in the pixels PX (e.g., see FIG. 3B). The hole control layer HCL may further include a hole transport layer. The hole transport layer may include at least one of a hole injection layer, a hole transport layer, and a single injection/transport layer serving as both a hole injection layer and a hole transport layer. For example, the hole transport layer may be formed of or include at least one of a hole injection material or a hole transport material. The hole control layer HCL may contain at least one of various materials that are known to be able to serve as the hole injection material and/or the hole transport material.

A light emitting layer EML may be disposed on the hole control layer HCL. The light emitting layer EML may be disposed in an area corresponding to the opening OP. The light emitting layer EML may include a plurality of isolated patterns, each of which is provided in a corresponding one of the pixels PX. The light emitting layer EML may be formed of or include an organic material and/or an inorganic material. The light emitting layer EML may generate a specific color light in response to a potential difference between the first electrode AE and a second electrode CE.

An electron control layer ECL may be disposed on the light emitting layer EML. Although not shown, the electron control layer ECL may be formed in common in the pixels PX (e.g., see FIG. 3B). The electron control layer ECL may further include an electron transport layer. The electron transport layer may include at least one of an electron transport material or an electron injection material. The electron transport area may be an electron transport layer containing an electron transport material or a single electron injection/transport layer containing an electron transport material and an electron injection material.

The second electrode CE may be disposed on the electron control layer ECL. The second electrode CE may be disposed in common in the pixels PX.

The upper insulating layer TFL may be disposed on the second electrode CE. The upper insulating layer TFL may include a plurality of layers, each of which is formed of an inorganic and/or organic material. For example, the upper insulating layer TFL may include an encapsulation layer TFE and a capping layer CPL.

The encapsulation layer TFE may be disposed to overlap the entire area of the display area DP-DA. The encapsulation layer TFE may cover the light emitting device OLED that is disposed in the display area DP-DA. The encapsulation layer TFE may include multiple layers, for example, an inorganic layer, an organic layer, and an inorganic layer that are sequentially stacked. For convenience in illustration and description, in FIG. 3B, the encapsulation layer TFE is illustrated as a single layer, but the inventive concept is not limited to this example.

The encapsulation layer TFE may be formed of or include at least one of inorganic materials, such as aluminum oxide, titanium oxide, silicon oxide, silicon oxynitride, zirconium oxide, and hafnium oxide.

The organic layer of the encapsulation layer TFE may be formed of or include at least one of acrylic resins, methacrylic resins, polyisoprene resins, vinyl resins, epoxy resins, urethane resins, cellulose resins, siloxane resins, polyimide resins, polyamide resins, and perylene resins.

The capping layer CPL may be disposed to fully cover the display and non-display areas DP-DA and DP-NDA. The capping layer CPL may cover the encapsulation layer TFE.

Figure 4B:
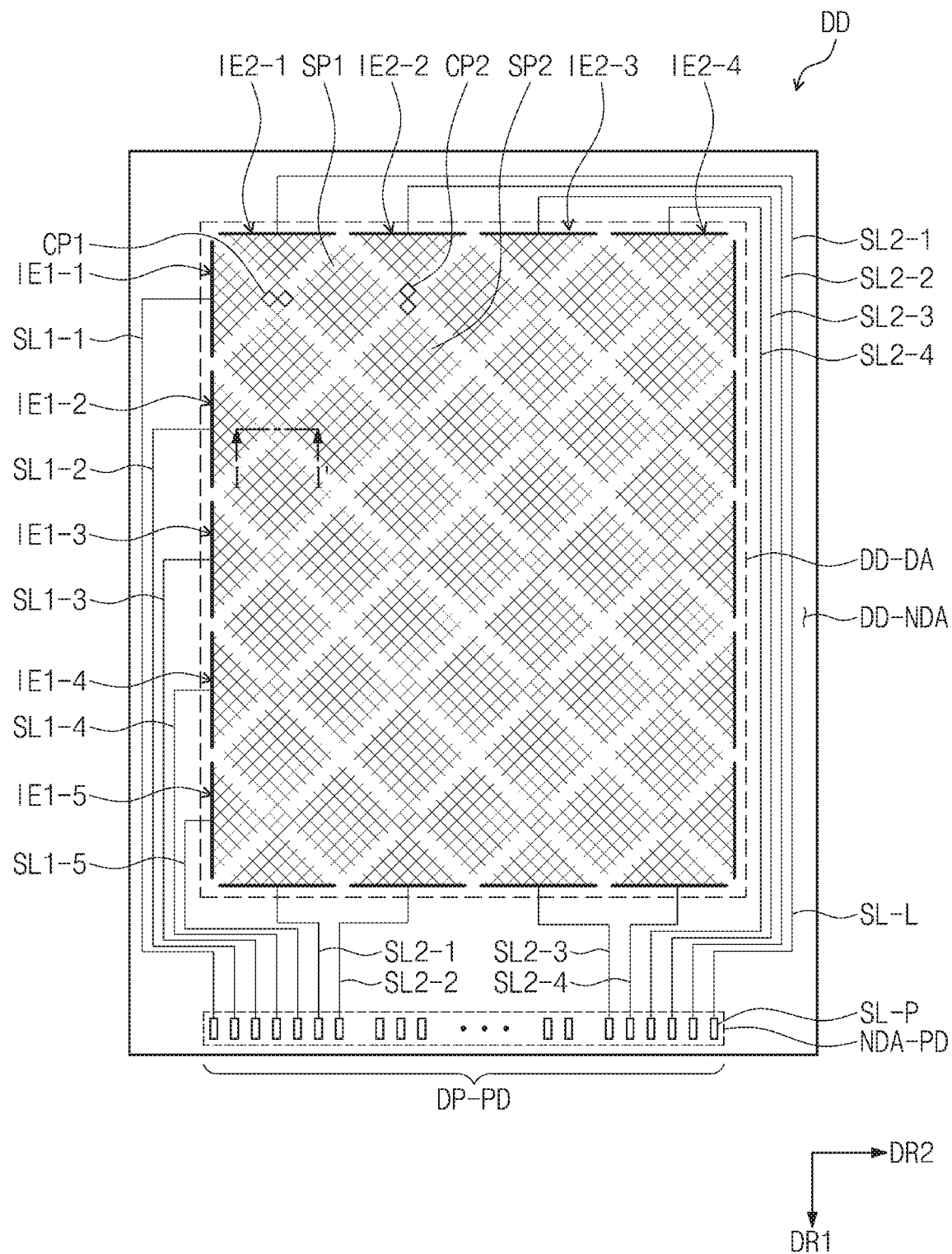
FIG. 4B is a plan view illustrating an input-sensor according to an embodiment of the inventive concept.
Figure 4C:
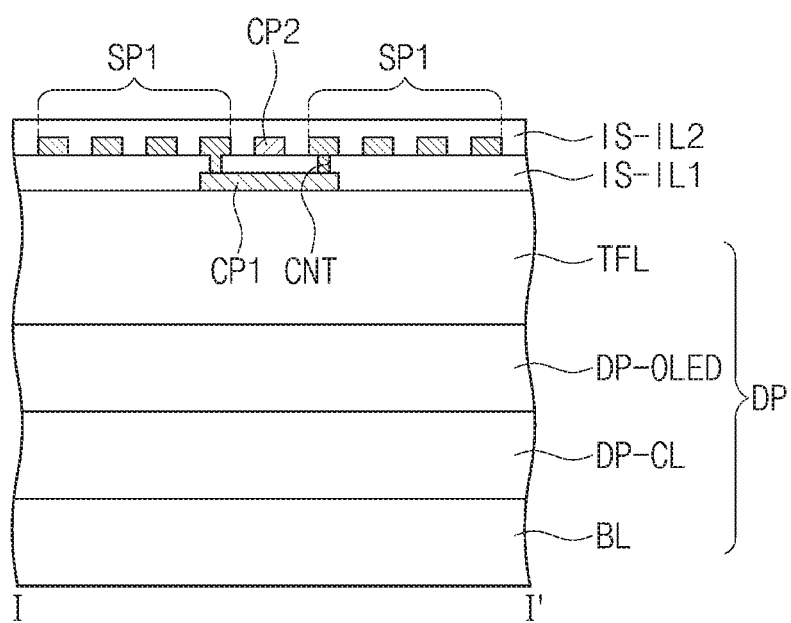
FIG. 4C is a sectional view taken along a line I-I' of FIG. 4B.

FIG. 4A is a sectional view illustrating a display device according to an embodiment of the inventive concept. FIG. 4B is a plan view illustrating an input-sensor according to an embodiment of the inventive concept. FIG. 4C is a sectional view taken along a line I-I' of FIG. 4B.

To provide better understanding of a stacking structure of the input-sensor ISL, the display panel DP is depicted in a simplified manner in FIG. 4A. For example, the anti-reflection member CFL and the window layer WL that may be disposed on the input-sensor ISL are omitted in FIG. 4A for convenience in illustration.

The input-sensor ISL may be configured to sense an external input, for example, by sensing a change of capacitance referred to as a capacitance-sensing method. The inventive concept is not limited to a specific sensing method of the input-sensor ISL, and in another embodiment, the input-sensor ISL may be configured to sense an external input in an electromagnetic induction manner or a pressure-sensing manner.

As shown in FIG. 4A, the input-sensor ISL may include a first conductive layer IS-CL1, a first insulating layer IS-IL1, a second conductive layer IS-CL2, and a second insulating layer IS-IL2. Each of the first and second conductive layers IS-CL1 and IS-CL2 may have a single-layered structure or a multi-layered structure including a plurality of layers stacked in the third direction DR3.

The conductive layer of the single-layered structure may include a metal layer or a transparent conductive layer. The metal layer may include at least one of molybdenum, silver, titanium, copper, aluminum, and an alloy thereof. The transparent conductive layer may include transparent conductive oxide, such as indium tin oxide (ITO), indium zinc oxide (IZO), zinc oxide (ZnO), and indium tin zinc oxide (ITZO). In an embodiment, the transparent conductive layer may include a conductive polymer, metal nanowires, and/or graphene.

The conductive layer of the multi-layered structure may include a plurality of metal layers. For example, the metal layers of the conductive layer may have a triple-layered structure of, for example, titanium/aluminum/titanium. The conductive layer of the multi-layered structure may include at least one metal layer and at least one transparent conductive layer.

Each of the first conductive layer IS-CL1 and the second conductive layer IS-CL2 may include a plurality of patterns. In the following description, the first conductive layer IS-CL1 will be described to include first conductive patterns, and the second conductive layer IS-CL2 will be described to include second conductive patterns. Each of the first and second conductive patterns may include sensing electrodes and signal lines.

At least one of the first insulating layer IS-IL1 and the second insulating layer IS-IL2 may include an inorganic layer. The inorganic layer may include at least one of aluminum oxide, titanium oxide, silicon oxide, silicon oxynitride, zirconium oxide, and hafnium oxide.

At least one of the first and second insulating layers IS-IL1 and IS-IL2 may include an organic layer. The organic layer may be formed of or include at least one of acrylic resins, methacrylic resins, polyisoprene resins, vinyl resins, epoxy resins, urethane resins, cellulose resins, siloxane resins, polyimide resins, polyamide resins, and perylene resins.

As shown in FIGS. 4B and 4C, the input-sensor ISL may include first sensing electrodes IE1-1 to IE1-5, first signal lines SL1-1 to SL1-5 respectively connected to the first sensing electrodes IE1-1 to IE1-5, second sensing electrodes IE2-1 to IE2-4, and second signal lines SL2-1 to SL2-4 respectively connected to the second sensing electrodes IE2-1 to IE2-4. Although not shown, the input-sensor ISL may further include an optical dummy electrode that is disposed in a boundary area between the first sensing electrodes IE1-1 to IE1-5 and the second sensing electrodes IE2-1 to IE2-4.

In an embodiment, the first sensing electrodes IE1-1 to IE1-5 and the second sensing electrodes IE2-1 to IE2-4 may include mesh-shaped lines. The first sensing electrodes IE1-1 to IE1-5 and the second sensing electrodes IE2-1 to IE2-4 including the mesh-shaped lines may reduce a parasitic capacitance between the sensing electrodes (i.e., the first sensing electrodes IE1-1 to IE1-5 and the second sensing electrodes IE2-1 to IE2-4) and the second electrode CE (e.g., see FIG. 3D). In addition, the input-sensor ISL may impart a flexible property because the first sensing electrodes IE1-1 to IE1-5 and the second sensing electrodes IE2-1 to IE2-4 include the mesh-shaped lines.

The input-sensor ISL may sense an external input in a mutual-capacitance manner and/or in a self-capacitance manner. In an embodiment, the input-sensor ISL may calculate coordinates of an external input using one of the mutual- and self-capacitance manners during a first period and re-calculate the coordinates of the external input using the other of the mutual- and self-capacitance manners during a second period subsequent to the first period. Furthermore, since, as will be described below, the first sensing electrodes IE1-1 to IE1-5 and the second sensing electrodes IE2-1 to IE2-4 do not overlap the light-emitting area PXA (e.g., see FIG. 3D), the first sensing electrodes IE1-1 to IE1-5 and the second sensing electrodes IE2-1 to IE2-4 may not be recognized by a user of the display device DD.

In the input-sensor ISL, the first sensing electrodes IE1-1 to IE1-5 may extend in the first direction DR1 and may be arranged in the second direction DR2, and the second sensing electrodes IE2-1 to IE2-4 and the first and second insulating layers IS-IL1 and IS-IL2 may extend in the second direction DR2 and may be arranged in the first direction DR1. The first sensing electrodes IE1-1 to IE1-5 may cross the second sensing electrodes IE2-1 to IE2-4 in a plan view.

Each of the first sensing electrodes IE1-1 to IE1-5 may include first sensors SP1 and first connecting portions CP1. In an embodiment, the first sensors SP1 may include mesh-shaped lines.

Each of the second sensing electrodes IE2-1 to IE2-4 may include second sensors SP2 and second connecting portions CP2. In an embodiment, the second sensors SP2 may include mesh-shaped lines.

In each of the first sensing electrodes IE1-1 to IE1-5, the first sensors SP1 may be arranged in the second direction DR2, and in each of the second sensing electrodes IE2-1 to IE2-4, the second sensors SP2 may be arranged in the first direction DR1. Each of the first connecting portions CP1 may connect adjacent ones of the first sensors SP1 to each other, and each of the second connecting portions CP2 may connect adjacent ones of the second sensors SP2 to each other.

In the present embodiment, the first connecting portions CP1 may be disposed at a different level or on a different layer from the first and second sensors SP1 and SP2 and the second connecting portions CP2. Thus, the first sensors SP1 may be disposed to be spaced apart from the second sensors SP2 and the second connecting portions CP2, when viewed in a plan view, and may be coupled to the first connecting portion CP1 through contact holes CNT that penetrate through the first insulating layer IS-ILL The first connecting portion CP1 may be formed of or include a material, whose resistance is lower than that of the first sensors SP1.

Meanwhile, the inventive concept is not limited to the above example or a specific embodiment. For example, in an embodiment, the first connecting portions CP1 may be disposed on the insulating layer or the first sensing electrodes IE1-1 to IE1-5 and the second sensing electrodes IE2-1 to IE2-4 may be disposed at a different level or on a different layer from each other with an insulating layer interposed therebetween.

Each of the first signal lines SL1-1 to SL1-5 may be connected to a one-side end of the first sensing electrodes IE1-1 to IE1-5, respectively. Each of the second signal lines SL2-1 to SL2-4 may be connected to both opposite ends of the second sensing electrodes IE2-1 to IE2-4, respectively. In an embodiment, each of the first signal lines SL1-1 to SL1-5 may also be connected to both opposite ends of the first sensing electrodes IE1-1 to IE1-5, respectively. In an embodiment, each of the second signal lines SL2-1 to SL2-4 may be connected to only a one-side end of the second sensing electrodes IE2-1 to IE2-4, respectively.

Each of the first and second signal lines SL1-1 to SL1-5 and SL2-1 to SL2-4 may include a line portion SL-L and a pad portion SL-P. The pad portions SL-P may be aligned to each other on a pad area NDA-PD. The input-sensor ISL may include signal pads DP-PD. The signal pads DP-PD may be aligned to the pad area NDA-PD. The signal pads DP-PD may overlap and connected to the pad portions SL-P of the first and second signal lines SL1-1 to SL1-5 and SL2-1 to SL2-4.

In an embodiment, the first signal lines SL1-1 to SL1-5 and the second signal lines SL2-1 to SL2-4 may be replaced with a circuit board that is separately fabricated.

Figure 5A:
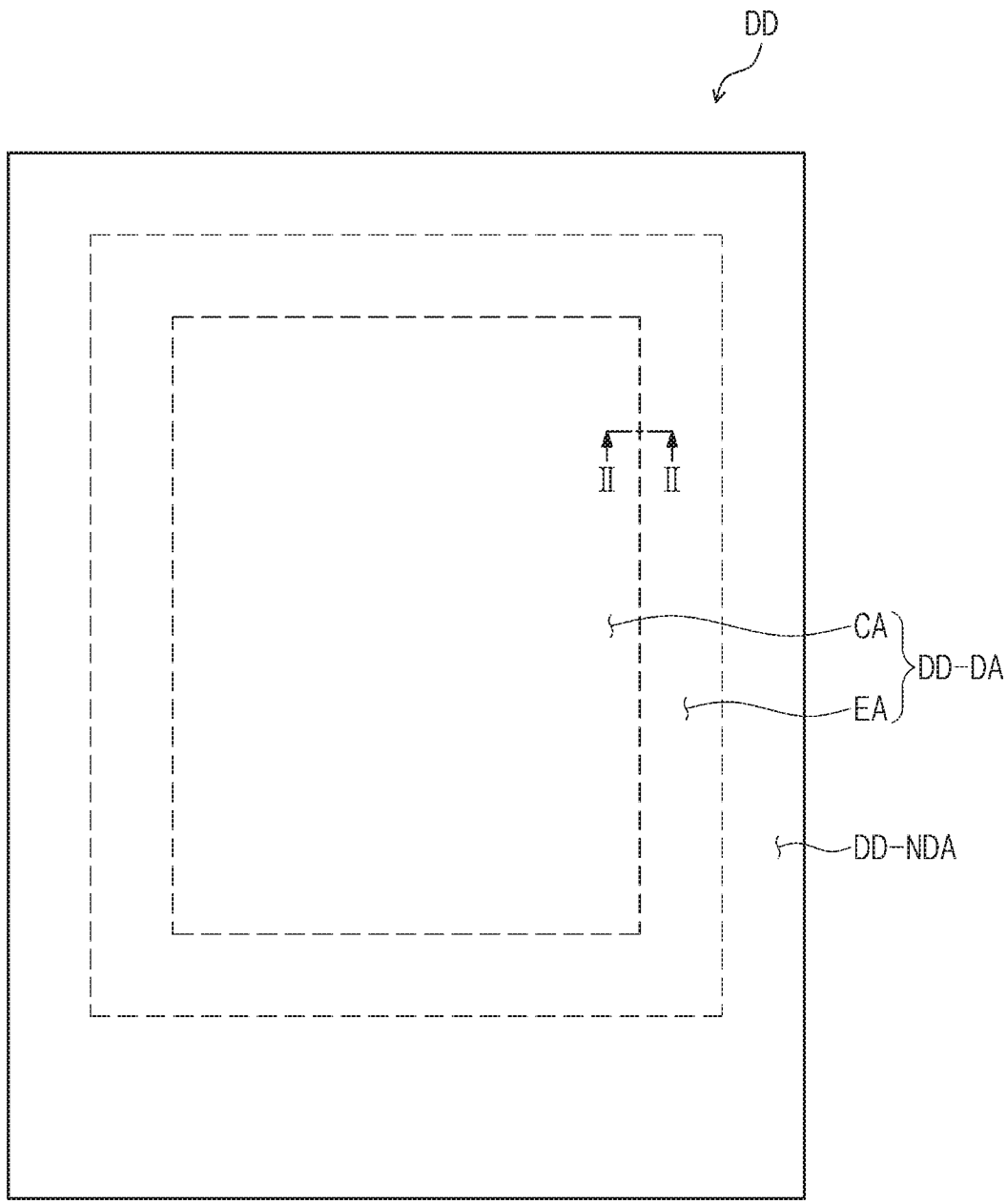
FIG. 5A is a plan view schematically illustrating a display device according to an embodiment of the inventive concept.
Figure 5B:
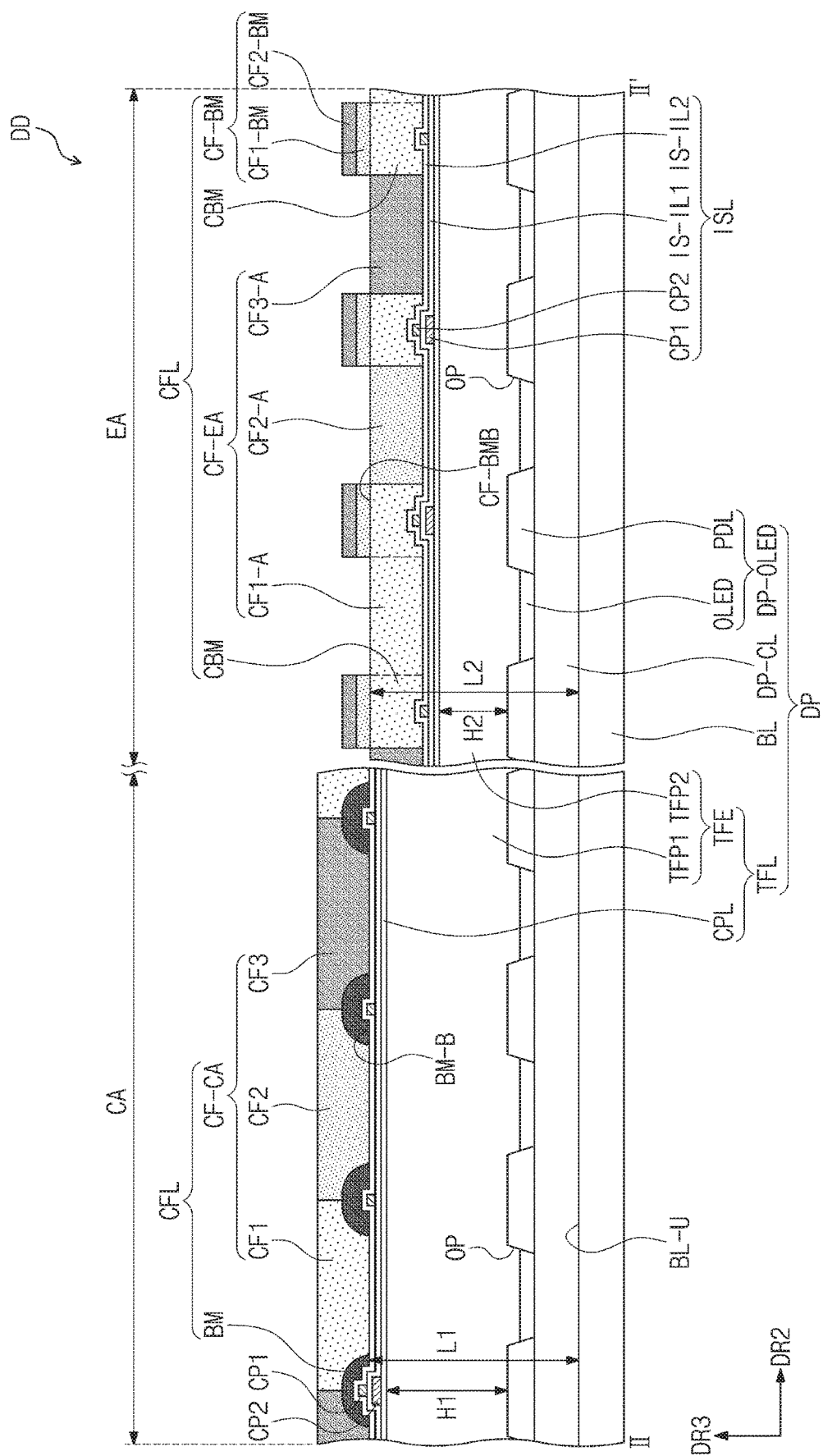
FIG. 5B is a sectional view taken along a line II-IT of FIG. 5A.
Figure 5C:
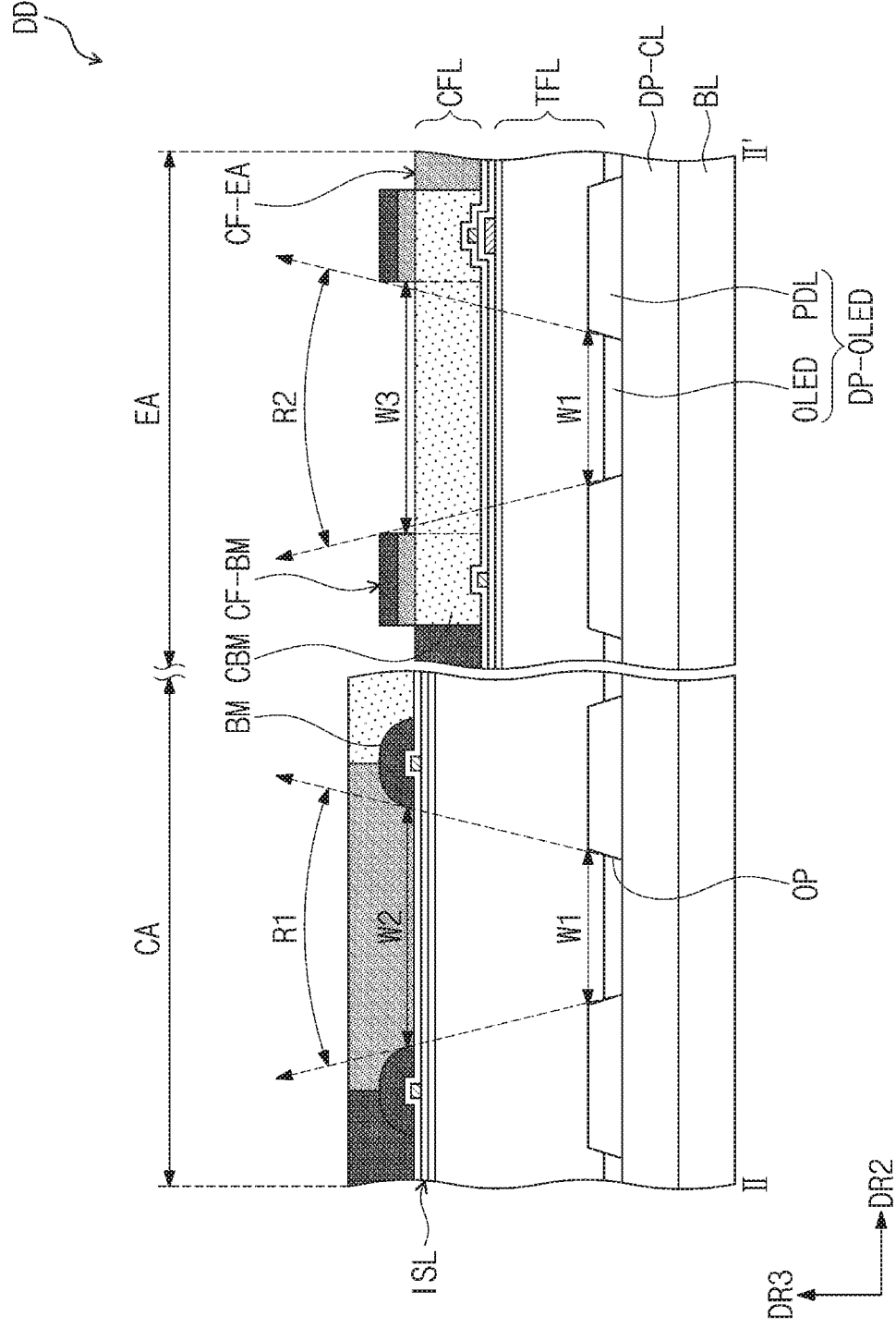
FIG. 5C is a sectional view illustrating a portion of a display device according to an embodiment of the inventive concept.

FIG. 5A is a plan view schematically illustrating a display device according to an embodiment of the inventive concept. FIG. 5B is a sectional view taken along a line II-IT of FIG. 5A. FIG. 5C is a sectional view illustrating a portion of a display device according to an embodiment of the inventive concept. In the following description, elements previously described with reference to FIGS. 1A to 4C may be identified by the same reference number without repeating their description. For convenience in description and illustration, the window layer WL and some elements of the display panel DP are omitted from FIGS. 5B to 5C. Hereinafter, a display device according to an embodiment of the inventive concept will be described in more detail with reference to FIGS. 5A to 5C.

Areas defined in the display device DD are briefly depicted by dotted lines in FIG. 5A. In an embodiment, the display area DP-DA may include the central area CA and the edge area EA enclosing the central area CA. The non-display area DP-NDA may be spaced apart from the central area CA with the edge area EA interposed therebetween.

Referring to FIG. 5B, the display device DD may include the display panel DP, the input-sensor ISL, and the anti-reflection member CFL. The display panel DP may include the base layer BL, the circuit device layer DP-CL, the display element layer DP-OLED, and the upper insulating layer TFL. The input-sensor ISL may be disposed on the display panel DP.

The upper insulating layer TFL may include the encapsulation layer TFE and the capping layer CPL. In an embodiment, the encapsulation layer TFE may include a first portion TFP1 overlapping the central area CA and a second portion TFP2 overlapping the edge area EA. The encapsulation layer TFE may have a multiple-layer structure, for example, including an inorganic layer, an organic layer, and an inorganic layer that are sequentially stacked. For convenience in illustration, the encapsulation layer TFE is illustrated as a single layer, but the inventive concept is not limited thereto.

When measured in the third direction DR3, a thickness H1 of the first portion TFP1 may be larger than a thickness H2 of the second portion TFP2. That is, a thickness of the encapsulation layer TFE may be larger in the central area CA than in the edge area EA. In an embodiment, the thickness H1 of the first portion TFP1 and the thickness H2 of the second portion TFP2 may correspond to a thickness of the organic layer of the encapsulation layer TFE.

The variation in the thickness of the organic layer of the encapsulation layer TFE may be caused by a process of forming the encapsulation layer TFE. For example, the organic layer of the encapsulation layer TFE may be formed by an inkjet process. In this case, owing to a fluidic property of the organic material supplied by the inkjet process, there may be a difference in a filling rate of the organic layer between the central area CA and the edge area EA, and thus, the organic material supplied onto the central area CA may flow toward the edge area EA when forming the encapsulation layer TFE. In this case, the thickness of the organic layer of the encapsulation layer TFE may vary from area to area. Although the first and second portions TFP1 and TFP2 are separately illustrated, the first and second portions TFP1 and TFP2 may correspond to two different but connected portions of the encapsulation layer TFE. In this sense, the difference between the thicknesses H1 and H2 of the first and second portions TFP1 and TFP2 may result from the variation in the thickness of the organic layer of the encapsulation layer TFE.

In an embodiment, the anti-reflection member CFL may be disposed over the input-sensor ISL. The anti-reflection member CFL may include light-blocking portions BM and CF-BM and color filter portions CF-CA, CF-EA, and CBM.

The color filter portions CF-CA, CF-EA, and CBM may include a central color filter portion CF-CA, an edge color filter portion CF-EA, and a partition pattern CBM. The light-blocking portions BM and CF-BM may include a first light-blocking pattern BM and a second light-blocking pattern CF-BM.

The central color filter portion CF-CA may include a first central color pattern CF1, a second central color pattern CF2, and a third central color pattern CF3. The central color filter portion CF-CA may be disposed in an area overlapping the central area CA. The first to third central color patterns CF1, CF2, and CF3 of the central color filter portion CF-CA may be arranged next to one another in sequence. A side surface of each of the first to third central color patterns CF1, CF2, and CF3 may be in contact with a side surface of an adjacent one of the first to third central color patterns CF1, CF2, and CF3.

Each of the first to third central color patterns CF1, CF2, and CF3 may be disposed to overlap a corresponding one of the openings OP defined in the pixel definition layer PDL. Thus, the central color filter portion CF-CA may be disposed to overlap the light emitting device OLED.

In an embodiment, the first central color pattern CF1, the second central color pattern CF2, and the third central color pattern CF3 may have different colors from each other.

The edge color filter portion CF-EA may include a first edge color pattern CF1-A, a second edge color pattern CF2-A, and a third edge color pattern CF3-A. The edge color filter portion CF-EA may be disposed in an area overlapping the edge area EA. The second and third edge color patterns CF2-A and CF3-A of the edge color filter portion CF-EA may be spaced apart from each other with the partition pattern CBM interposed therebetween. The first edge color pattern CF1-A of the edge color filter portion CF-EA may be formed of or include substantially the same material as the partition pattern CBM and may be connected to the partition pattern CBM. For example, although, for convenience in description, they are described as separate elements, the first edge color pattern CF1-A and the partition pattern CBM may correspond to different portions of a single pattern that is formed by the same process.

In an embodiment, the first edge color pattern CF1-A, the second edge color pattern CF2-A, and the third edge color pattern CF3-A may have different colors from each other. However, the first central color pattern CF1 and the first edge color pattern CF1-A may have the same color, and the second central color pattern CF2 and the second edge color pattern CF2-A may have the same color. Furthermore, the third central color pattern CF3 and the third edge color pattern CF3-A may have the same color. In an embodiment, the color patterns of the same color may be formed by the same process.

The color filter portions CF-CA, CF-EA, and CBM may decrease reflectance of an external light reflected by the display panel DP. The color filter portions CF-CA, CF-EA, and CBM serving as an anti-reflection layer to an external light may improve an external light blocking efficiency and light-emitting efficiency of the display device DD compared with a display device including a polarization plate in the form of an additional film or substrate.

The first light-blocking pattern BM may be disposed in an area overlapping the first portion TFP1. The first light-blocking pattern BM may be disposed to overlap the pixel definition layer PDL without overlapping the opening OP. Thus, the first light-blocking pattern BM may block light that may be emitted from the non-light-emitting area NPXA.

In addition, the first light-blocking pattern BM may be disposed to overlap at least one of the first connecting portions CP1 and the second connecting portions CP2 of the input-sensor ISL. The first light-blocking pattern BM may be formed of or include at least one of opaque materials including metallic materials (e.g., chromium (Cr), silver (Ag), molybdenum (Mo), nickel (Ni), titanium (Ti), and tantalum (Ta)), oxides of the metallic materials, and organic materials. The first light-blocking pattern BM may improve light-leakage and contrast properties of the display device DD.

The edge color filter portion CF-EA may be disposed in an area overlapping the edge area EA. The first to third edge color patterns CF1-A, CF2-A, and CF3-A of the edge color filter portion CF-EA may be spaced apart from each other. Each of the first to third central color patterns CF1, CF2, and CF3 may be disposed to overlap a corresponding one of the openings OP defined in the pixel definition layer PDL.

The partition pattern CBM may be disposed in an area overlapping the edge area EA. The partition pattern CBM may be formed of or include the same material as the first edge color pattern CF1-A. The second edge color pattern CF2-A and the third edge color pattern CF3-A may be spaced apart from each other with the partition pattern CBM interposed therebetween. Although a border between the first edge color pattern CF1-A and the partition pattern CBM on the edge area EA is depicted by a dotted line in FIG. 5B, the first edge color pattern CF1-A and the partition pattern CBM may correspond to two different but connected portions of a single pattern that is formed of the same material.

The second light-blocking pattern CF-BM may be disposed in an area overlapping the second portion TFP2. The second light-blocking pattern CF-BM may overlap the pixel definition layer PDL without overlapping the opening OP. The second light-blocking pattern CF-BM may overlap the partition pattern CBM.

In an embodiment, the second light-blocking pattern CF-BM may include a plurality of layers. For example, the second light-blocking pattern CF-BM may include a first light-blocking layer CF1-BM and a second light-blocking layer CF2-BM. The second light-blocking layer CF2-BM may be disposed on the first light-blocking layer CF1-BM. In an embodiment, the partition pattern CBM and the second light-blocking pattern CF-BM of different colors may be stacked to prevent or suppress an external light from being reflected by the display device DD.

In the present embodiment, the first light-blocking pattern BM may be covered with the central color filter portion CF-CA. By contrast, the second light-blocking pattern CF-BM may be disposed on the partition pattern CBM.

Figure 9:
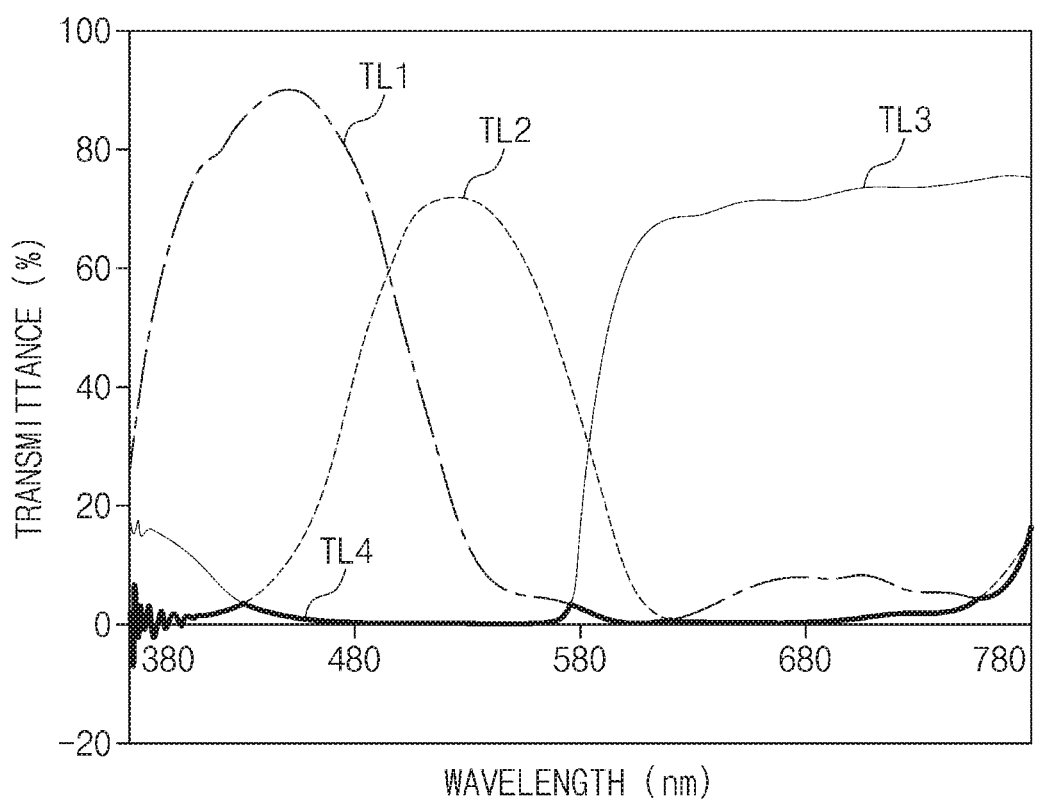
FIG. 9 is a graph showing transmittance characteristics of patterns of different colors.

FIG. 9 is a graph showing transmittance characteristics of patterns of different colors. In the graph of FIG. 9, x and y axes represent wavelength and transmittance of light, respectively. A first pattern TL1 transmitted light in a wavelength range from about 380 nm to 550 nm. For example, the first pattern TL1 was substantially transparent to blue light. A second pattern TL2 transmitted light within a wavelength range from about 460 nm to 620 nm. For example, the second pattern TL2 was substantially transparent to green light. A third pattern TL3 transmitted light having a wavelength of about 580 nm or longer. For example, the third pattern TL3 was substantially transparent to red light.

A fourth pattern TL4 may be formed to contain all pigment or dye materials used in the first to third patterns TL1, TL2, and TL3. The fourth pattern TL4 exhibits a low transmittance property to light within a wavelength range from 380 nm to 780 nm. As a result, the fourth pattern TL4 has transmittance lower than the first to third patterns TL1, TL2, and TL3.

The first color patterns CF1 and CF1-A and the partition pattern CBM may be formed of or include the same material as the second pattern TL2. For example, the first color patterns CF1 and CF1-A may be formed of or include a material containing green pigment or green dye. In this case, if a white light is incident thereto, the first color patterns CF1 and CF1-A may absorb light in red and blue wavelength ranges and may transmit light in a green wavelength range.

The second color patterns CF2 and CF2-A and the first light-blocking layer CF1-BM may be formed of or include the same material as the third pattern TL3. For example, the second color patterns CF2 and CF2-A may be formed of or include a material containing red pigment or red dye. In this case, if a white light is incident thereto, the second color patterns CF2 and CF2-A may absorb light in a wavelength range from blue to green and may transmit light in a red wavelength range.

The third color patterns CF3 and CF3-A and the second light-blocking layer CF2-BM may be formed of or include the same material as the first pattern TL1. For example, the third color patterns CF3 and CF3-A may be formed of or include a material containing blue pigment or blue dye. In this case, if a white light is incident thereto, the third color patterns CF3 and CF3-A may absorb light in red and green wavelength ranges and may transmit light in a blue wavelength range.

According to an embodiment of the inventive concept, the partition pattern CBM disposed in the edge area EA and the second light-blocking pattern CF-BM stacked on the partition pattern CBM may have different colors, and the partition pattern CBM and the second light-blocking pattern CF-BM may have a transmittance property similar to that of the fourth pattern TL4. Thus, the partition pattern CBM and the second light-blocking pattern CF-BM may block light that may be leaked from the display device DD, similar to the first light-blocking pattern BM disposed in the central area CA.

In an embodiment, a distance L1 from a top surface BL-U of the base layer BL to the first light-blocking pattern BM may be substantially same as a distance L2 from the top surface BL-U of the base layer BL to the second light-blocking pattern CF-BM.

A height difference between the first and second portions TFP1 and TFP2 of the encapsulation layer TFE may be compensated by a thickness of the edge color filter portion CF-EA. In other words, the distance L1 from the top surface BL-U of the base layer BL to a bottom surface BM-B of the first light-blocking pattern BM disposed on the input-sensor ISL may be substantially same as the distance L2 from the top surface BL-U of the base layer BL to a bottom surface CF-BMB of the second light-blocking pattern CF-BM disposed on the partition pattern CBM. Thus, the bottom surface BM-B of the first light-blocking pattern BM may be substantially coplanar with the bottom surface CF-BMB of the second light-blocking pattern CF-BM.

FIG. 5C illustrates a first light-emission area R1 of one pixel PX (e.g., see FIG. 3B) disposed in the central area CA and a second light-emission area R2 of another pixel PX disposed in the edge area EA.

In an embodiment, when measured in the second direction DR2, the largest width (hereinafter, a first width W1) of the opening OP may be smaller than a second width W2 between the first light-blocking patterns BM. In addition, the first width W1 may be smaller than a third width W3 between the second light-blocking patterns CF-BM. In an embodiment, the second width W2 may be substantially the same as the third width W3. Thus, the second light-emission area R2 in the edge area EA may have substantially the same area as the first light-emission area R1 in the central area CA.

According to an embodiment of the inventive concept, the height difference between the first and second portions TFP1 and TFP2 of the encapsulation layer TFE may be compensated by the edge color filter portion CF-EA. That is, the light-blocking portions BM and CF-BM respectively disposed in the central area CA and the edge area EA may have the same vertical position in the third direction DR3, and this may reduce a difference in brightness ratio between the first light-emission area R1 in the central area CA and the second light-emission area R2 in the edge area EA and thereby to improve white angle difference (WAD) characteristics of the display device DD.

Figure 6:
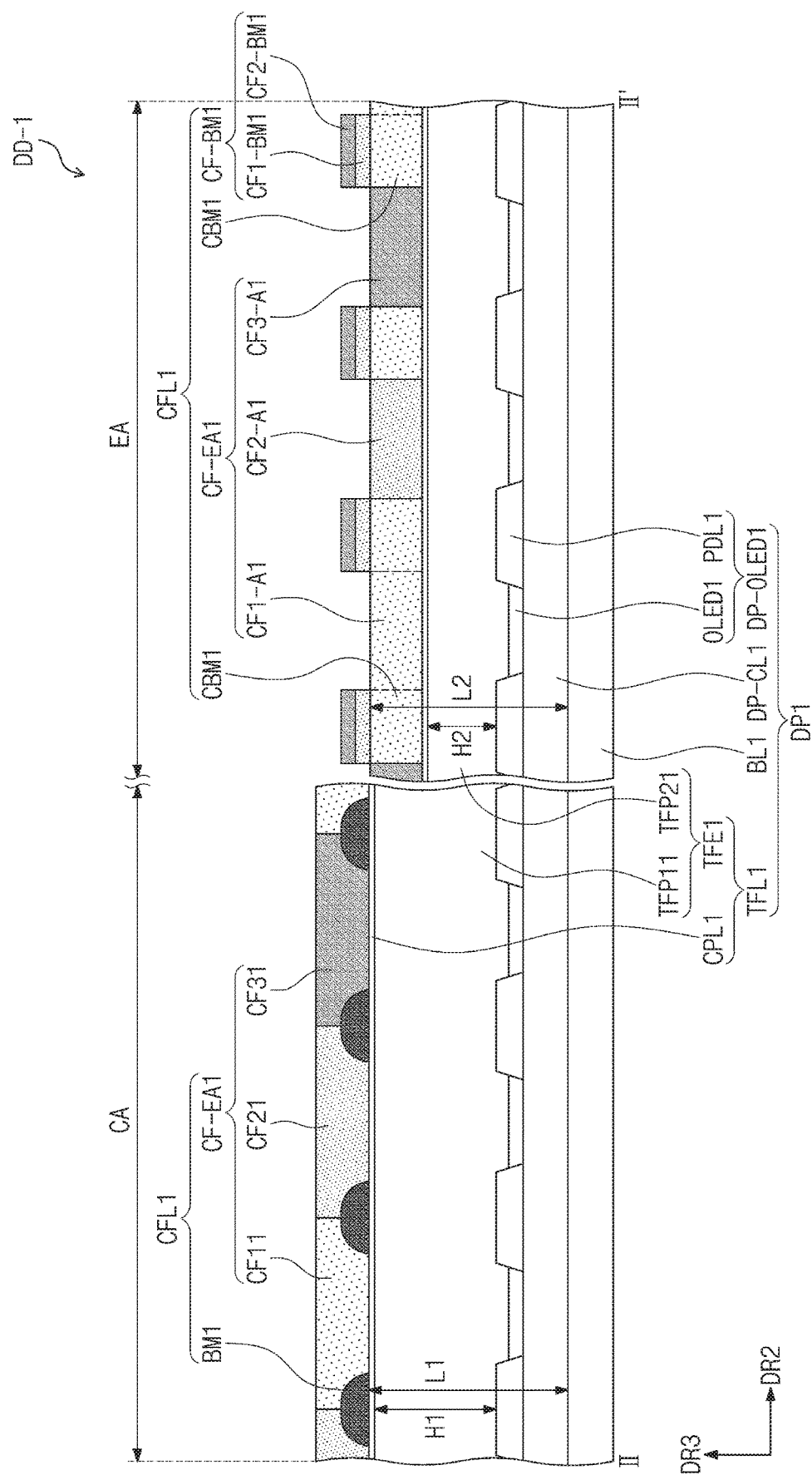
FIG. 6 is a sectional view illustrating a display device according to an embodiment of the inventive concept.

FIG. 6 is a sectional view illustrating a display device according to an embodiment of the inventive concept. In the following description, elements previously described with reference to FIGS. 1A to 5B may be identified by the same reference number without repeating their description.

Unlike the display device DD of FIG. 5B, the input-sensor ISL (e.g., see FIG. 5B) may be omitted from a display device DD-1 shown in FIG. 6. Accordingly, an anti-reflection member CFL1 may be disposed on a capping layer CPL1.

A height difference between a first portion TFP11 and a second portion TFP21 of an encapsulation layer TFE1 of an upper insulating layer TFL1 may be compensated by an edge color filter portion CF-EA1, and thus, a first light-blocking pattern BM1 in the central area CA and a second light-blocking pattern CF-BM1 in the edge area EA may have bottom surfaces that are coplanar with each other.

Figure 7A:
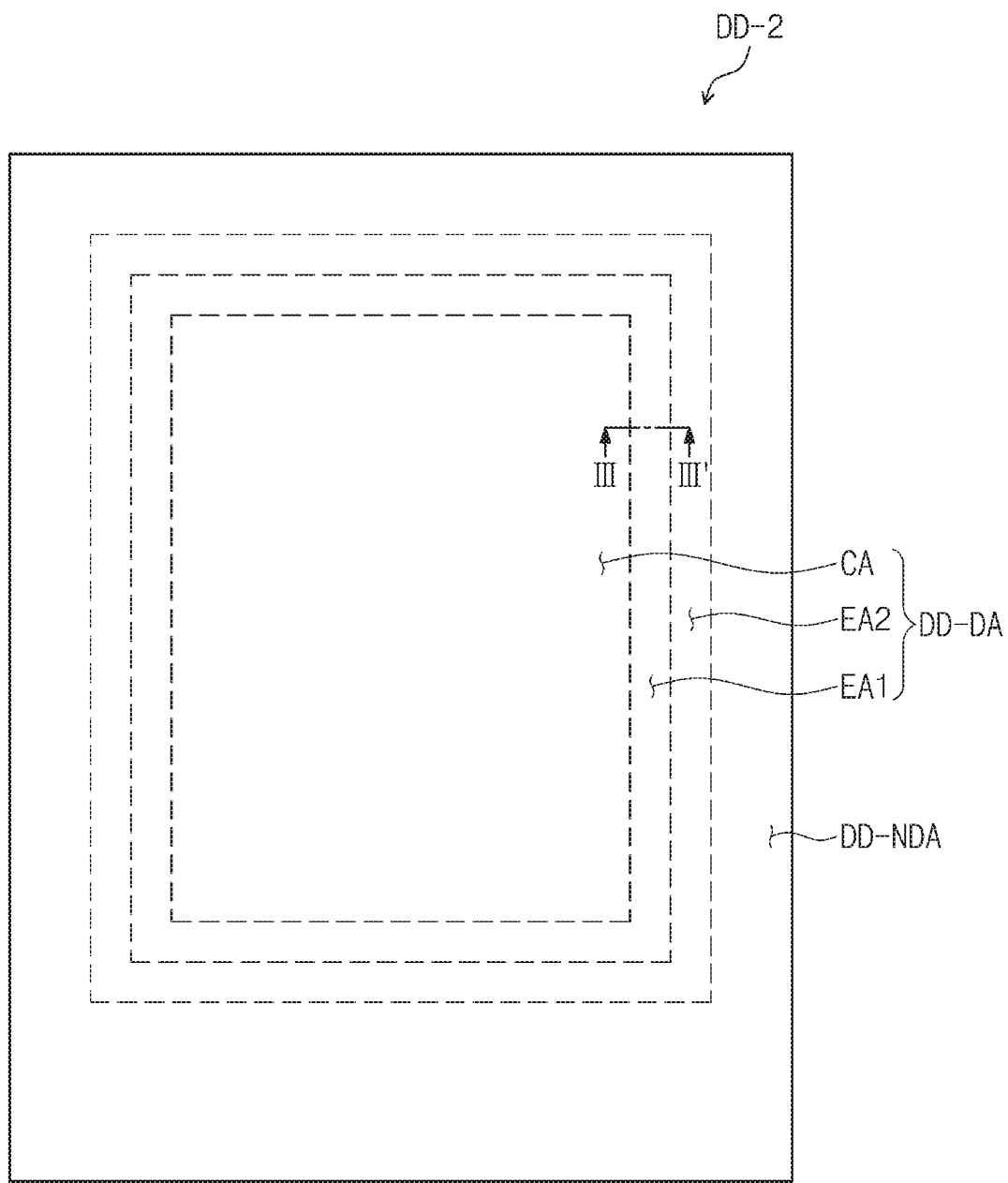
FIG. 7A is a plan view schematically illustrating a display device according to an embodiment of the inventive concept.
Figure 7B:
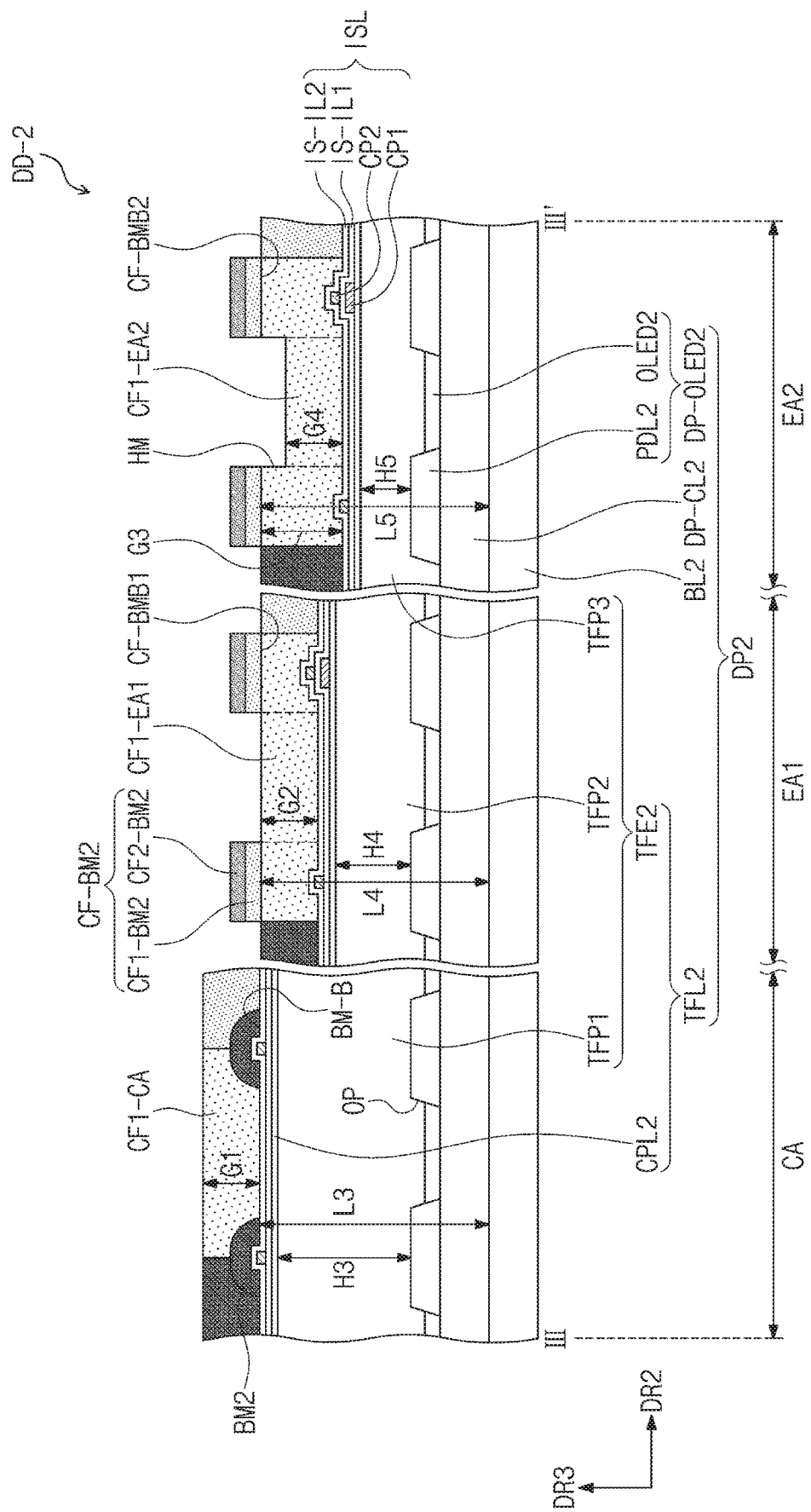
FIG. 7B is a sectional view taken along a line III-III' of FIG. 7A.

FIG. 7A is a plan view schematically illustrating a display device according to an embodiment of the inventive concept. FIG. 7B is a sectional view taken along a line III-III' of FIG. 7A. In the following description, elements previously described with reference to FIGS. 1A to 5B may be identified by the same reference number without repeating their description. For convenience in description and illustration, the window layer WL and some elements of the display panel DP are omitted from FIG. 7B. Hereinafter, a display device according to an embodiment of the inventive concept will be described in more detail with reference to FIGS. 7A and 7B.

Areas defined in a display device DD-2 are briefly depicted by dotted lines in FIG. 7A. In an embodiment, the display area DP-DA may include the central area CA and edge areas EA1 and EA2 enclosing the central area CA. The non-display area DP-NDA may be spaced apart from the central area CA with the edge areas EA1 and EA2 interposed therebetween. A first edge area EA1 may enclose the central area CA. A second edge area EA2 may enclose the first edge area EA1. That is, the second edge area EA2 may be farther from the central area CA than the first edge area EA1.

Referring to FIG. 7B, an encapsulation layer TFE2 may include a first portion TFP1 overlapping the central area CA, a second portion TFP2 overlapping the first edge area EA1, and a third portion TFP3 overlapping the second edge area EA2. In an embodiment, a thickness of the encapsulation layer TFE2 may decrease in a direction from the central area CA toward the second edge area EA2. For example, when measured in the third direction DR3, a thickness H3 of the first portion TFP1 may be larger than a thickness H4 of the second portion TFP2. The thickness H4 of the second portion TFP2 may be larger than a thickness H5 of the third portion TFP3. Thus, a thickness of the encapsulation layer TFE2 may be larger on the central area CA than on the edge areas EA1 and EA2.

The differences in height between the first and second portions TFP1 and TFP2 and between the second and third portions TFP2 and TFP3 in the encapsulation layer TFE2 may be compensated by edge color filter portions CF1-EA1 and CF1-EA2. Thus, light-blocking portions BM2 and CF-BM2 may have bottom surfaces that are coplanar with each other.

Since the thickness H4 of the second portion TFP2 is larger than the thickness H5 of the third portion TFP3, a thickness G2 of the first edge color filter portion CF1-EA1 may be smaller than a thickness G3 of the second edge color filter portion CF1-EA2.

In an embodiment, a second edge color filter portion CF1-EA2 may include a recessed area HM. The recessed area HM may overlap the opening OP that is located on the second edge area EA2. A portion of the second edge color filter portion CF1-EA2 overlapping the recessed area HM may have a thickness G4 that is smaller than a thickness (e.g., the thickness G3) of another portion of the second edge color filter portion CF1-EA2 except the recessed area HM. Furthermore, the thickness G4 of the second edge color filter portion CF1-EA2 may be substantially the same as the thickness G2 of the first edge color filter portion CF1-EA1 and may be substantially the same as a thickness G1 of a central color filter portion CF1-CA.

In the display device DD-2 according to an embodiment of the inventive concept, the varying height of the encapsulation layer TFE2 (e.g., decreasing in a direction from the central area CA toward the edge areas EA1 and EA2) may be compensated by using the edge color filter portions CF1-EA1 and CF1-EA2, and the outermost color filter portion CF1-EA2 may be partially removed to reduce a difference in brightness ratio between the central area CA and the edge areas EA1 and EA2 of the display device DD-2.

FIGS. 8A to 8G are sectional views illustrating a method of fabricating a display device, according to an embodiment of the inventive concept. In the following description, elements previously described with reference to FIGS. 1A to 5B may be identified by the same reference number without repeating their description.

Figure 8A:
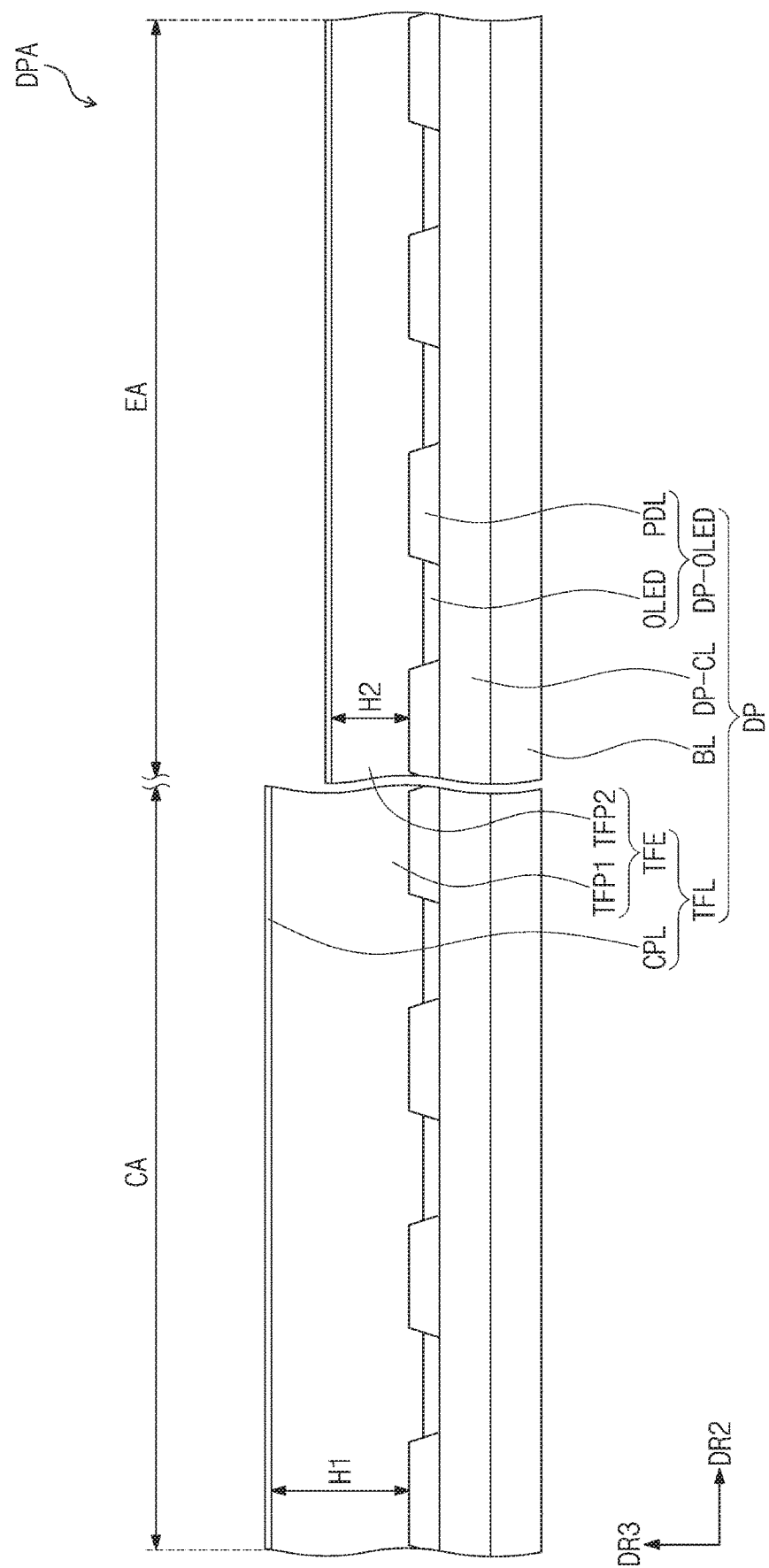
FIGS. 8A to 8G are sectional views illustrating a method of fabricating a display device, according to an embodiment of the inventive concept.

Referring to FIG. 8A, a preliminary display panel DPA may be provided to fabricate a display device. The circuit device layer DP-CL and the display element layer DP-OLED that are electrically connected to each other may be formed by performing a plurality of deposition and etching processes on the base layer BL of the preliminary display panel DPA. Thereafter, the upper insulating layer TFL may be formed to cover the circuit device layer DP-CL. The upper insulating layer TFL may include the encapsulation layer TFE covering the display element layer DP-OLED and the capping layer CPL covering the encapsulation layer TFE.

The display element layer DP-OLED may include the pixel definition layer PDL that is formed by coating the circuit device layer DP-CL with an organic material and performing a patterning process such as a photolithography process. The patterning on the organic material may be performed to form a plurality of openings OP that expose the light emitting device OLED in the pixel definition layer PDL. Although for convenience in illustration, some elements are omitted from FIG. 8A, the circuit device layer DP-CL shown in FIG. 8A may be formed to have substantially the same structure as the circuit device layer DP-CL and the circuit device layer DP-CL as shown in FIG. 3D.

The upper insulating layer TFL may include a plurality of layers, each of which may be formed of an inorganic and/or organic material. The inorganic material may include at least one of aluminum oxide, titanium oxide, silicon oxide, silicon oxynitride, zirconium oxide, and hafnium oxide. The organic material may include at least one of acrylic resins, methacrylic resins, polyisoprene resins, vinyl resins, epoxy resins, urethane resins, cellulose resins, siloxane resins, polyimide resins, polyamide resins, and perylene resins.

The organic layer of the encapsulation layer TFE may be formed by an inkjet process. In this case, owing to a fluidic property of the organic material supplied by the inkjet process, there may be a difference in a filling rate between the organic materials formed on the central area CA and the edge area EA. Thus, the organic material supplied onto the central area CA may flow toward the edge area EA when forming the encapsulation layer TFE. In this case, the thickness of the encapsulation layer TFE may vary from area to area. Accordingly, the preliminary display panel DPA may have a height difference H1-H2 between the first and second portions TFP1 and TFP2 that are respectively disposed in the central area CA and the edge area EA of the encapsulation layer TFE.

Figure 8B:
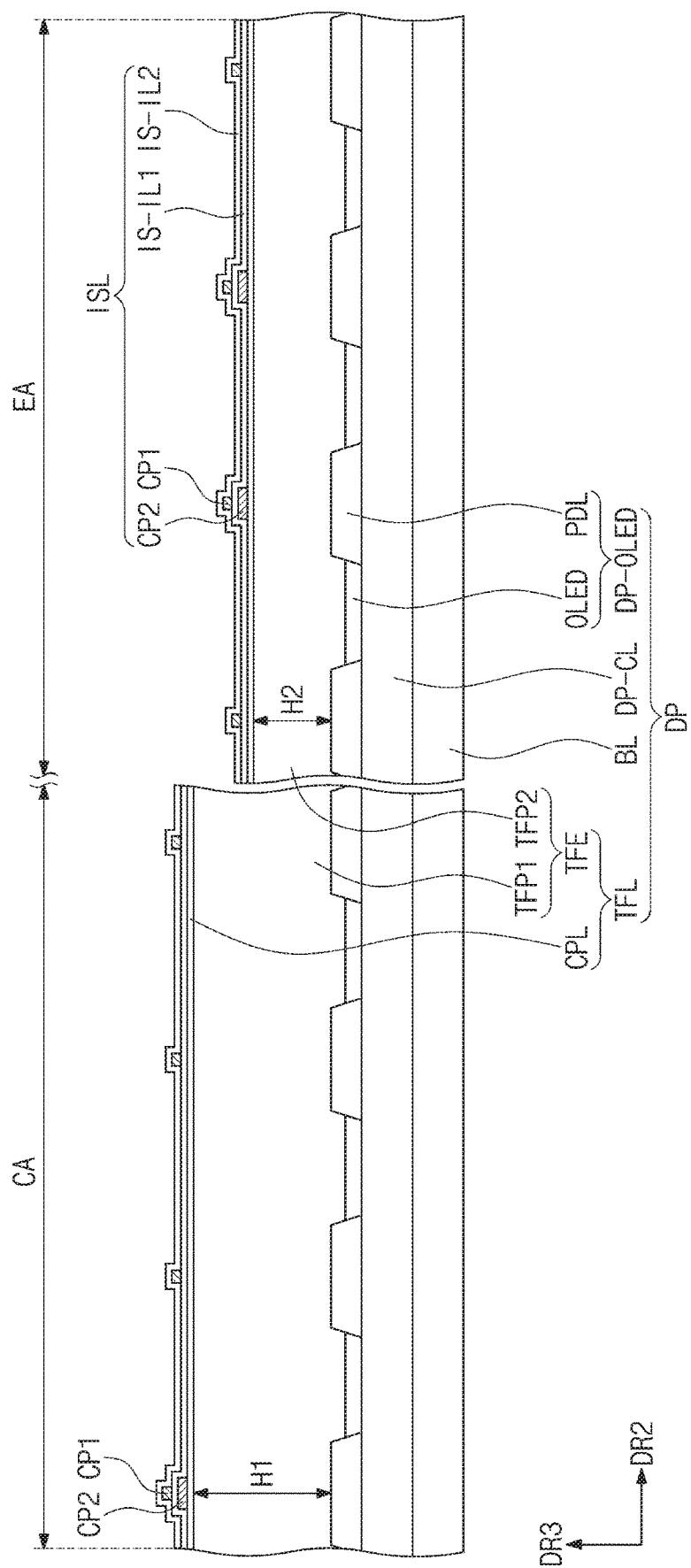

Thereafter, as shown in FIG. 8B, the input-sensor ISL may be formed on the preliminary display panel DPA (e.g., see FIG. 8A). The input-sensor ISL may include the first and second connecting portions CP1 and CP2 that overlap the pixel definition layer PDL without overlapping the opening OP.

Figure 8C:
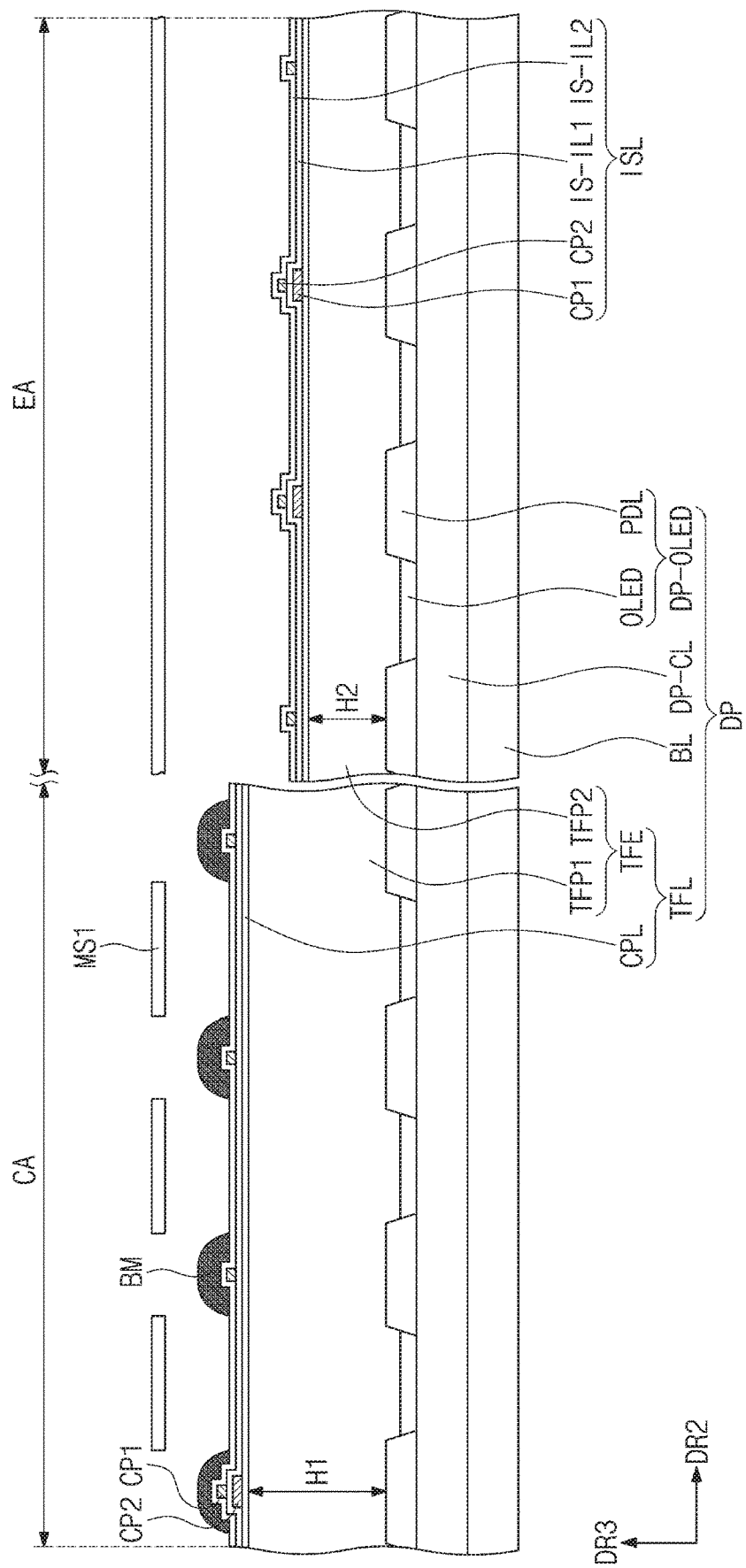

Thereafter, as shown in FIG. 8C, a light-blocking pattern BM may be formed. The light-blocking pattern BM may be formed using a first mask MS1. The light-blocking pattern BM may be formed by selectively depositing an optically opaque organic material on the pixel defining layer PDL using the first mask MS1.

The first mask MS1 may have an opening that overlap the pixel definition layer PDL in the central area CA, and thus, the light-blocking pattern BM may be formed to overlap the pixel definition layer PDL in the central area CA.

Figure 8D:
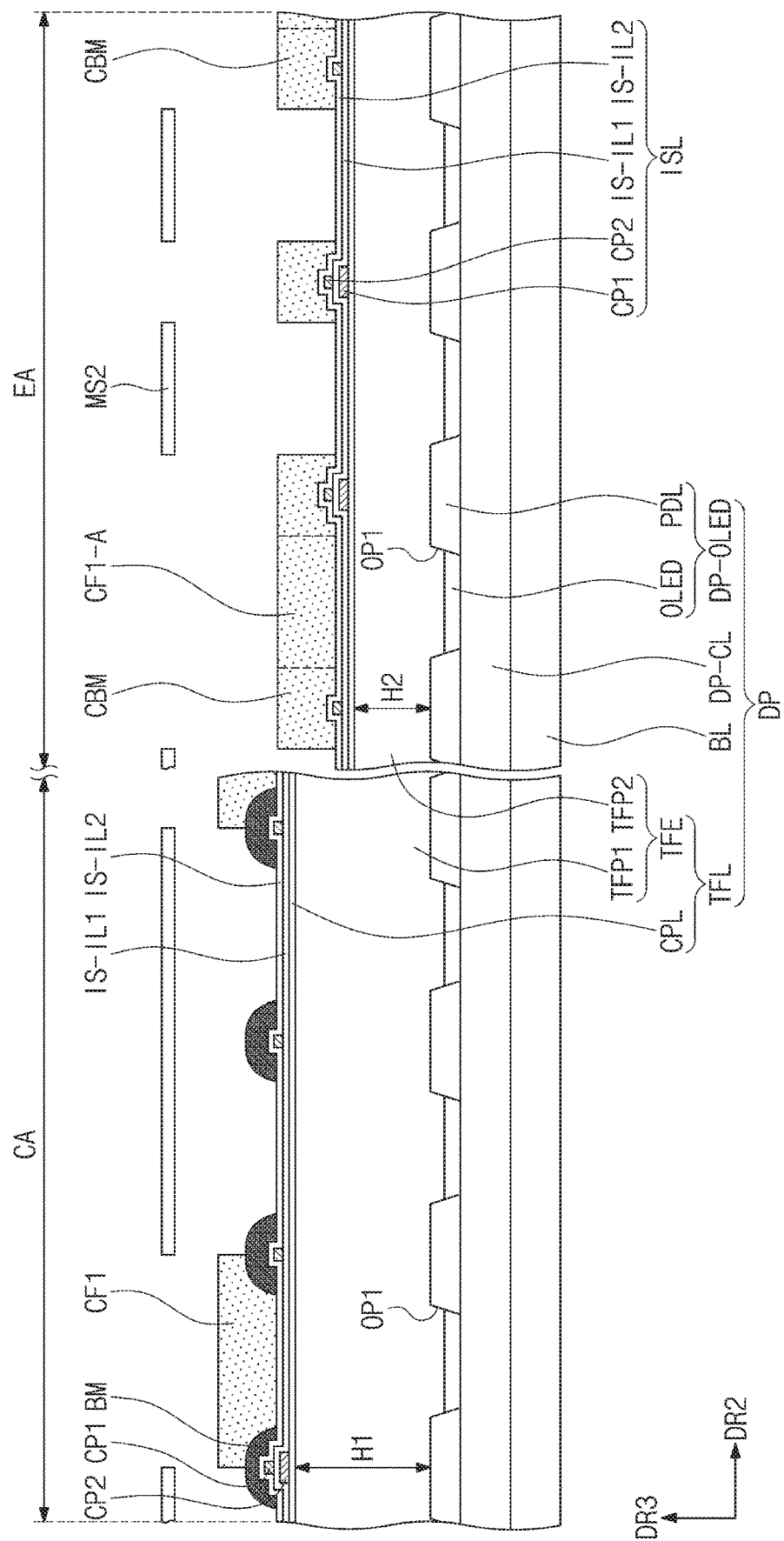

Thereafter, as shown in FIG. 8D, the first color patterns CF1 and CF1-A and the partition pattern CBM may be formed. The first color patterns CF1 and CF1-A and the partition pattern CBM may be formed using a second mask MS2. The first color patterns CF1 and CF1-A and the partition pattern CBM may be formed by selectively depositing a first organic material using the second mask MS2. The first organic material may be a different material from the organic material of the light-blocking pattern BM.

The second mask MS2 may have an opening that overlaps openings OP1 of the pixel definition layer PDL in the central area CA and the edge area EA. In addition, in the edge area EA, the second mask MS2 may have an opening that overlaps a portion of the pixel definition layer PDL adjacent to one of the openings OP1. Thus, the first color patterns CF1 and CF1-A may be formed to overlap the openings OP1 in the central area CA and the edge area EA, and the partition pattern CBM may be formed to overlap the pixel definition layer PDL in the edge area EA.

The first color pattern CF1-A and the partition pattern CBM on the edge area EA are connected portions of the first organic material but are illustrated as separate elements for convenience in illustration.

Figure 8E:
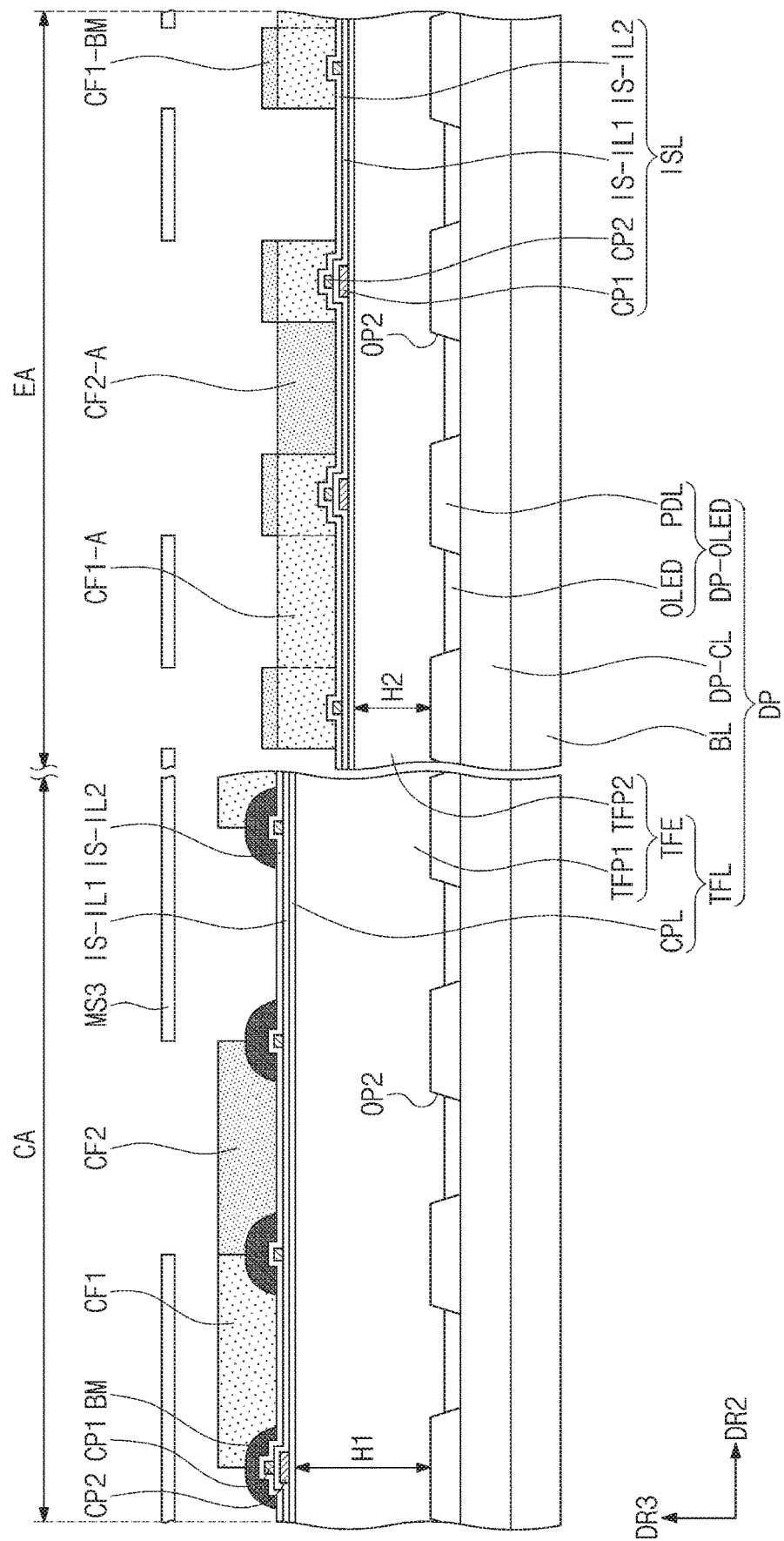

Thereafter, as shown in FIG. 8E, the second color patterns CF2 and CF2-A and the first light-blocking layer CF1-BM may be formed. The second color patterns CF2 and CF2-A and the first light-blocking layer CF1-BM may be formed by using a third mask MS3. The second color patterns CF2 and CF2-A and the first light-blocking layer CF1-BM may be formed by selectively depositing a second organic material using the third mask MS3. The second organic material may have a color that is different from that of the first organic material.

The third mask MS3 may be have an opening that overlaps openings OP2 of the pixel definition layer PDL in the central area CA and the edge area EA. In addition, the third mask MS3 may have an opening that overlaps the pixel definition layer PDL in the edge area EA and adjacent to the openings OP2. Thus, the second color patterns CF2 and CF2-A may be formed to overlap the openings OP2 in the central area CA and the edge area EA, and the first light-blocking layer CF1-BM may be formed on the partition pattern CBM.

Figure 8F:
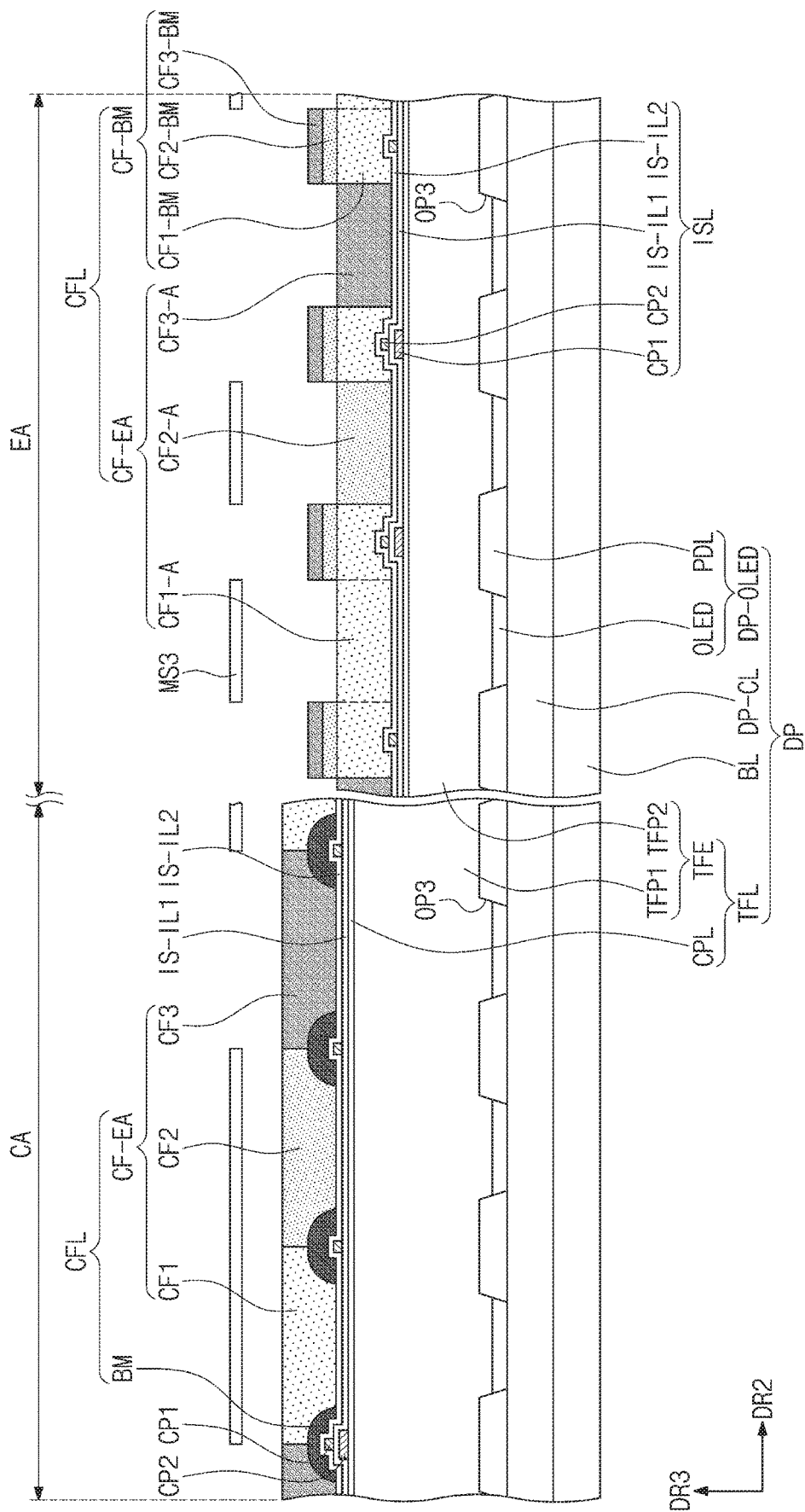

Thereafter, as shown in FIG. 8F, the third color patterns CF3 and CF3-A and the second light-blocking layer CF2-BM may be formed. The third color patterns CF3 and CF3-A and the second light-blocking layer CF2-BM may be formed using a fourth mask MS4. The third color patterns CF3 and CF3-A and the second light-blocking layer CF2-BM may be formed by selectively depositing a third organic material using the fourth mask MS4. The third organic material may have a color that is different from both of the first and second organic materials.

The fourth mask MS4 may be formed to have openings OP3 of the pixel definition layer PDL in the central area CA and the edge area EA. In addition, the third mask MS3 may be formed to have an opening that overlaps the pixel definition layer PDL in the edge area EA and adjacent to the openings OP3. Thus, the third color patterns CF3 and CF3-A may be formed to overlap the openings OP3 in the central area CA and the edge area EA, and the second light-blocking layer CF2-BM may be formed on the first light-blocking layer CF1-BM to overlap the partition pattern CBM.

Figure 8G:
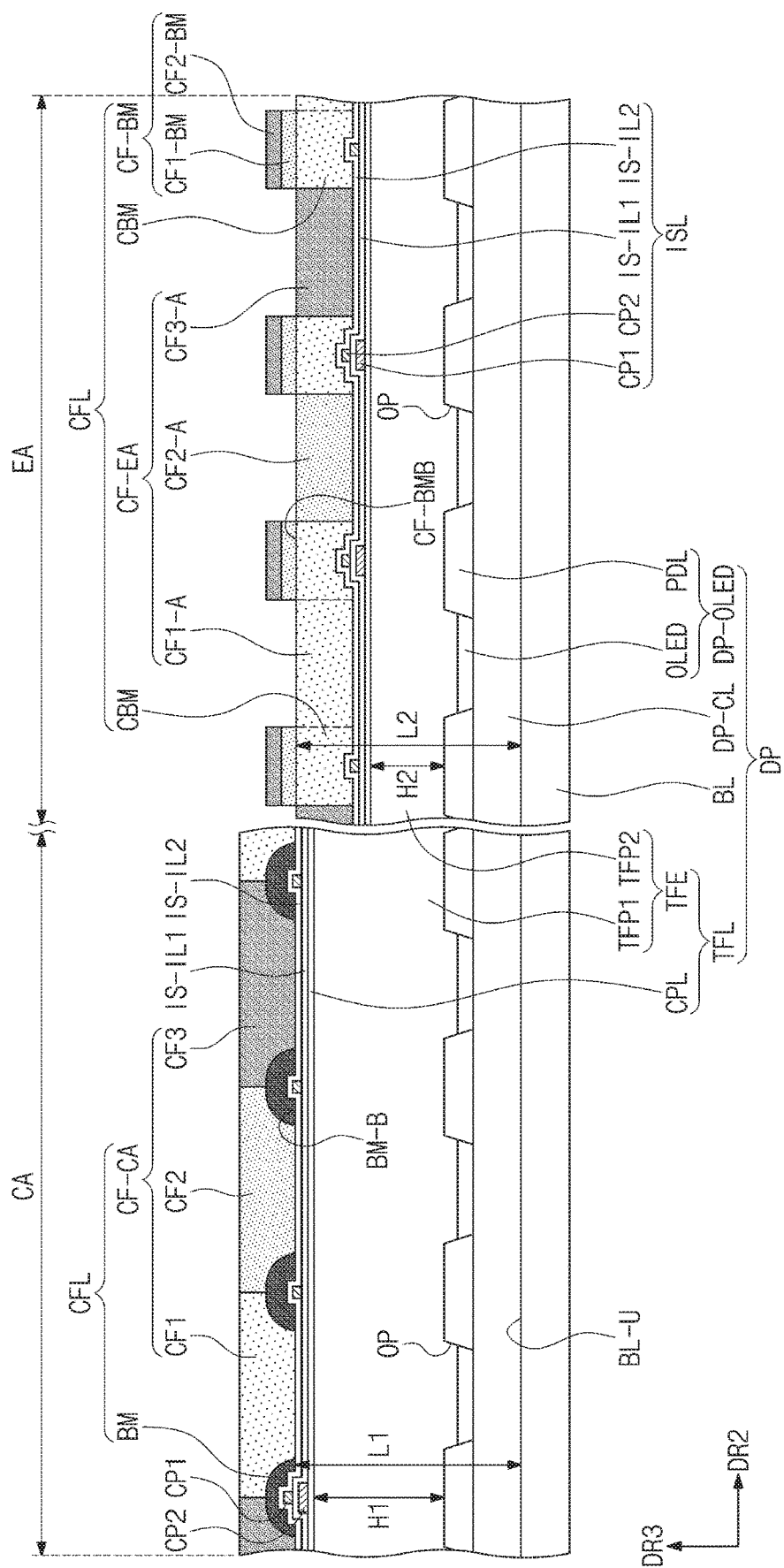

Referring to FIG. 8G, the display device DD may have the height difference H1-H2 between the first and second portions TFP1 and TFP2 of the encapsulation layer TFE, but the height difference H1-H2 is compensated by a thickness of the edge color filter portion CF-EA. Thus, the light-blocking portions BM and CF-BM in the central area CA and the edge area EA may be formed to have bottom surfaces that are coplanar with each other, thereby reducing a difference in a brightness ratio between lights emitted through the central area CA and the edge area EA and improving white angle difference (WAD) characteristics.

Furthermore, instead of providing a polarization plate in the form of an additional film or substrate, the color filter portions CF-CA, CF-EA, and CBM disposed in the display device DD may serve an anti-reflection layer to an external light, and the display device DD may have an improved external light blocking efficiency and light-emitting efficiency. In addition, a thickness and fabrication cost of the display panel DP may be reduced compared with a display device including the polarization plate.

According to an embodiment of the inventive concept, a variation in height of encapsulation layer may be compensated by a thickness of a color filter portion, and thus, a light-blocking portion may be placed at the same level throughout the entire area of a display panel. Accordingly, the display panel may have substantially the same brightness ratio throughout the entire area and may have improved white angle difference (WAD) characteristics.

According to an embodiment of the inventive concept, due to an anti-reflection member provided in the display device, the display device may have an improved external light blocking efficiency and light-emitting efficiency. Furthermore, it may be possible to reduce a thickness and fabrication cost of the display panel.

While example embodiments of the inventive concept have been particularly shown and described, it will be understood by one of ordinary skill in the art that variations in form and detail may be made therein without departing from the spirit and scope of the present disclosure including the attached claims.

What is claimed is:

1. A display device, comprising:
a display panel including a base layer, a pixel definition layer, a light emitting device, and an encapsulation layer;
the base layer including a display area including a central area and an edge area that encloses the central area and a non-display area adjacent to the display area,
the pixel definition layer being disposed in the display area and having an opening,
the light emitting device emitting light through the opening, and
the encapsulation layer covering the pixel definition layer and the light emitting device and comprising a first portion overlapping the central area and a second portion overlapping the edge area and adjacent to the first portion;
an input-sensor comprising conductive patterns that do not overlap the opening and are disposed at different levels on the display panel, and an insulating layer that is disposed between the conductive patterns; and
an anti-reflection member disposed on the input-sensor, the anti-reflection member comprising a light-blocking portion overlapping the pixel definition layer and a color filter portion overlapping the opening,
wherein the light-blocking portion comprises:
a first light-blocking pattern disposed on the first portion and covered with the color filter portion; and
a second light-blocking pattern disposed on the second portion and on the color filter portion.

2. The display device of claim 1, wherein a first thickness of the first portion is larger than a second thickness of the second portion.

3. The display device of claim 2, wherein when measured in a thickness direction of the display panel, a distance from a top surface of the base layer to the first light-blocking pattern is substantially same as a distance from the top surface of the base layer to the second light-blocking pattern.

4. The display device of claim 2, wherein a plurality of openings is provided,
the color filter portion comprises:
a first color pattern, a second color pattern, and a third color pattern that do not overlap respective ones of the plurality of openings and have different colors from each other; and
a partition pattern disposed in the edge area and overlapping the pixel definition layer, and
wherein the partition pattern has a substantially same color as the first color pattern.

5. The display device of claim 4, wherein, in the central area, the first color pattern, the second color pattern, and the third color pattern are arranged next to one another in sequence, and
in the edge area, the second color pattern and the third color pattern are spaced apart from each other with the partition wall member interposed therebetween.

6. The display device of claim 5, wherein the first color pattern in the edge area is connected to the partition pattern.

7. The display device of claim 4, wherein the second light-blocking pattern comprises a first light-blocking layer and a second light-blocking layer containing same materials as the second color pattern and the third color pattern, respectively, and
each of the first light-blocking layer and the second light-blocking layer is disposed on and overlaps the partition pattern.

8. The display device of claim 4, wherein one color pattern of the first color pattern, the second color pattern, and the third color pattern that overlaps the edge area and is closest to the non-display area includes a recessed area, and
a third thickness of a portion of the one color pattern overlapping the recessed area is substantially same as a fourth thickness of another color pattern adjacent thereto.

9. A display device, comprising:
a display panel including a base layer, a pixel definition layer, a light emitting device, and an encapsulation layer, the base layer including a display area including a central area and an edge area that encloses the central area and a non-display area adjacent to the display area, the pixel definition layer being disposed in the display area and having an opening, the light emitting device emitting light through the opening, and the encapsulation layer covering the pixel definition layer and the light emitting device and comprising a first portion overlapping the central area and a second portion overlapping the edge area and connected to the first portion;
an input-sensor comprising conductive patterns that do not overlap the opening and are disposed at different levels on the display panel, and an insulating layer that is disposed between the conductive patterns; and
an anti-reflection member disposed on the input-sensor, the anti-reflection member comprising a light-blocking portion overlapping the pixel definition layer and a color filter portion overlapping the opening,
wherein the light-blocking portion comprises a first light-blocking pattern that overlaps the first portion and is covered with the color filter portion, and a second light-blocking pattern that overlaps the second portion and is disposed on the color filter portion, and
when measured in a thickness direction of the display panel, a distance from a top surface of the base layer to the first light-blocking pattern is substantially same as a distance from the top surface of the base layer to the second light-blocking pattern.

10. The display device of claim 9, wherein a first thickness of the first portion is larger than a second thickness of the second portion.

11. The display device of claim 10, wherein a plurality of openings is provided,
the color filter portion comprises:
a first color pattern, a second color pattern, and a third color pattern that overlap respective ones of the plurality of openings and have different colors from each other; and
a partition pattern disposed in the edge area and overlapping the pixel definition layer, and
wherein the partition pattern has a substantially same color as the first color pattern.

12. The display device of claim 11, wherein the first light-blocking pattern is covered with first color pattern, second color pattern, and the third color pattern disposed in the central area, and
the second light-blocking pattern is disposed on the partition pattern.

13. The display device of claim 12, wherein the second light-blocking pattern comprises a first light-blocking layer and a second light-blocking layer that are stacked in sequence,
the first light-blocking layer has a same color as the second color pattern, and the second light-blocking layer has a same color as the third color pattern.

14. The display device of claim 11, wherein a plurality of second light-blocking patterns is provided, and
a distance between adjacent ones of the plurality of second light-blocking patterns is larger than a largest distance between adjacent ones of the plurality of openings.

15. The display device of claim 11, wherein, in the central area, the first color pattern, the second color pattern, and the third color pattern are arranged next to one another in sequence, and
in the edge area, the second color pattern and the third color pattern are spaced apart from each other with the partition wall member interposed therebetween.

16. The display device of claim 11, wherein a third thickness of the partition pattern is substantially same as a fourth thickness of a portion of the first color pattern overlapping the second portion.

17. A method of fabricating a display device, comprising:
providing a preliminary display panel including a base layer, a pixel definition layer, and light emitting devices, the base layer including a central area and an edge area that encloses the central area, the pixel definition layer being formed on the base layer and having a plurality of openings, and each of the light emitting devices emitting light through a corresponding one of the plurality of openings;
forming an encapsulation layer to cover the base layer, the encapsulation layer containing a first organic material;
providing a second organic material using a first mask to form a light-blocking pattern on the pixel definition layer formed in the central area, the second organic material containing an optically opaque material;
providing a third organic material using a second mask to form a first color pattern that overlaps at least one of the plurality of openings formed in each of the central area and the edge area, and a partition pattern that overlaps the pixel definition layer formed in the edge area;
providing a fourth organic material using a third mask to form a second color pattern that is spaced apart from the first color pattern and overlaps at least one of the plurality of openings formed in each of the central area and the edge area, and a first light-blocking layer that is provided on the partition pattern, the fourth organic material having a different color from the third organic material; and
providing a fifth organic material using a fourth mask to form a third color pattern that is spaced apart from the second color pattern and overlaps at least one of the plurality of openings formed in each of the central area and the edge area, and a second light-blocking layer that is provided on the first light-blocking layer, the fifth organic material having a different color from the third organic material and the fourth organic material.

18. The method of claim 17, wherein the first color pattern, the second color pattern, and the third color pattern are formed to cover the light-blocking pattern.

19. The method of claim 17, wherein the first color pattern and the partition pattern in the edge area are simultaneously formed as a single-connected pattern.

20. The method of claim 17, further comprising directly forming an input-sensor including conductive patterns on the encapsulation layer,
wherein the input-sensor overlaps the pixel definition layer without overlapping the plurality of openings.

* * * * *